US011670516B2

(12) United States Patent
Colinjivadi et al.

(10) Patent No.: US 11,670,516 B2
(45) Date of Patent: Jun. 6, 2023

(54) METAL-CONTAINING PASSIVATION FOR HIGH ASPECT RATIO ETCH

(71) Applicant: Lam Research Corporation, Fremont, CA (US)

(72) Inventors: Karthik S. Colinjivadi, San Jose, CA (US); Samantha SiamHwa Tan, Fremont, CA (US); Shih-Ked Lee, Fremont, CA (US); George Matamis, Danville, CA (US); Yongsik Yu, Milpitas, CA (US); Yang Pan, Los Altos, CA (US); Patrick Van Cleemput, San Jose, CA (US); Akhil Singhal, Beaverton, OR (US); Juwen Gao, San Jose, CA (US); Raashina Humayun, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 4 days.

(21) Appl. No.: 17/259,526

(22) PCT Filed: Aug. 19, 2019

(86) PCT No.: PCT/US2019/047095
§ 371 (c)(1),
(2) Date: Jan. 11, 2021

(87) PCT Pub. No.: WO2020/041213
PCT Pub. Date: Feb. 27, 2020

(65) Prior Publication Data
US 2021/0242032 A1 Aug. 5, 2021

Related U.S. Application Data

(60) Provisional application No. 62/722,337, filed on Aug. 24, 2018.

(51) Int. Cl.
*H01L 21/311* (2006.01)
*H01L 21/02* (2006.01)

(52) U.S. Cl.
CPC .. *H01L 21/31116* (2013.01); *H01L 21/02063* (2013.01); *H01L 21/31144* (2013.01)

(58) Field of Classification Search
None
See application file for complete search history.

(56) References Cited

U.S. PATENT DOCUMENTS

2006/0043536 A1\* 3/2006 Co ............... H01L 21/32139
257/632
2006/0264054 A1 11/2006 Gutsche et al.
(Continued)

OTHER PUBLICATIONS

International Search Report from International Application No. PCT/US2019/047095 dated Dec. 6, 2019.
(Continued)

*Primary Examiner* — Allan W. Olsen
(74) *Attorney, Agent, or Firm* — Beyer Law Group LLP

(57) ABSTRACT

Various embodiments herein relate to methods, apparatus, and systems for etching a feature in a substrate. Typically the feature is etched in a dielectric-containing stack. The etching process involves cyclically etching the feature and depositing a protective film on sidewalls of the partially etched feature. These stages are repeated until the feature reaches its final depth. The protective film may have a particular composition, for example including at least one of a tungsten carbonitride, a tungsten sulfide, tin, a tin-containing compound, molybdenum, a molybdenum-containing compound, a ruthenium carbonitride, a ruthenium sulfide, an aluminum carbonitride, an aluminum sulfide, zirconium, and a zirconium-containing compound. A number of optional steps may be taken including, for example, doping the mask layer,
(Continued)

pre-treating the substrate prior to deposition, removing the protective film from the sidewalls, and oxidizing any remaining protective film.

20 Claims, 10 Drawing Sheets

(56) References Cited

U.S. PATENT DOCUMENTS

| | | | |
|---|---|---|---|
| 2008/0003770 A1* | 1/2008 | Enomoto | G01S 7/5208 |
| | | | 438/411 |
| 2009/0275202 A1 | 11/2009 | Tanaka et al. | |
| 2015/0179414 A1* | 6/2015 | Xiao | G03F 7/0002 |
| | | | 216/46 |
| 2016/0027645 A1 | 1/2016 | Shin et al. | |
| 2016/0163558 A1* | 6/2016 | Hudson | C23C 16/56 |
| | | | 156/345.24 |
| 2016/0318758 A1 | 11/2016 | Chou et al. | |
| 2017/0076955 A1* | 3/2017 | Hudson | H01L 21/02164 |
| 2017/0170026 A1 | 6/2017 | Hudson et al. | |
| 2017/0178920 A1* | 6/2017 | Dole | H01J 37/32137 |
| 2020/0090945 A1* | 3/2020 | Dole | H01J 37/32449 |
| 2021/0407817 A1* | 12/2021 | Marchegiani | H01L 21/3115 |
| 2022/0199417 A1* | 6/2022 | Henri | H01L 21/31116 |

OTHER PUBLICATIONS

Written Opinion from International Application No. PCT/US2019/047095 dated Dec. 6, 2019.

* cited by examiner

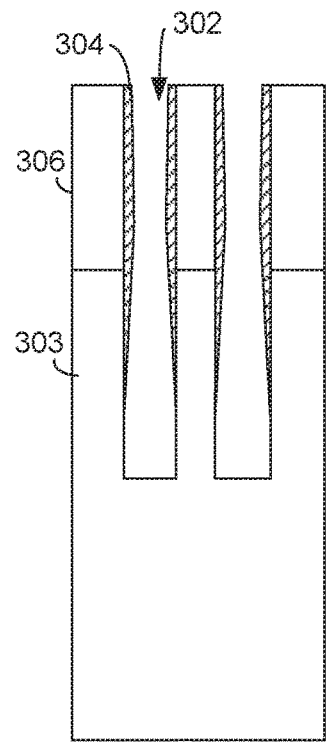
FIG. 3A
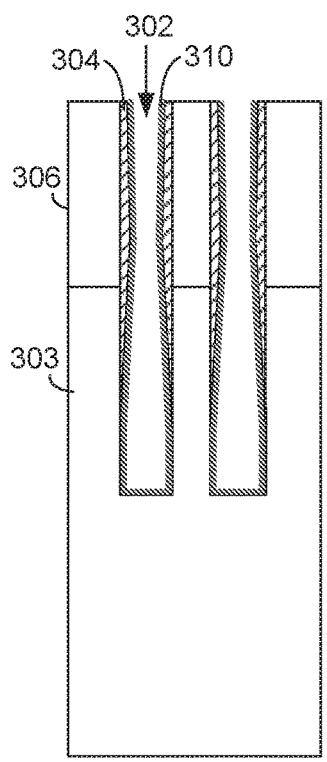 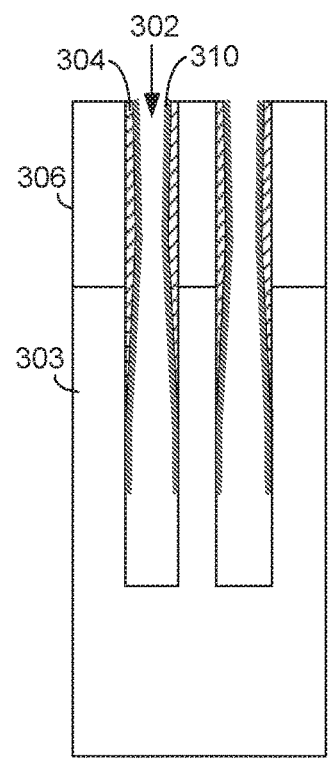
FIG. 3B FIG. 3C

METAL-CONTAINING PASSIVATION FOR HIGH ASPECT RATIO ETCH

CROSS REFERENCE TO RELATED APPLICATION

This application claims the benefit of priority of U.S. Application No. 62/722,337 dated Aug. 24, 2018, which is incorporated herein by references for all purposes.

FIELD

The embodiments herein are described in the context of etching a feature into dielectric material. The feature may be a cylinder or trench, for example.

BACKGROUND

One process frequently employed during fabrication of semiconductor devices is formation of an etched cylinder or trench in dielectric material. Example contexts where such a process may occur include, but are not limited to, memory applications such as DRAM and 3D NAND structures. As the semiconductor industry advances and device dimensions become smaller, such features become increasingly harder to etch in a uniform manner, especially for high aspect ratio features having narrow widths and/or deep depths.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Certain embodiments herein relate to methods and apparatus for forming an etched feature in a dielectric-containing stack on a substrate.

In one aspect of the embodiments herein, a method of forming an etched feature in a dielectric-containing stack on a substrate is provided, the method including: (a) partially etching the feature in the dielectric-containing stack by exposing the substrate to a first plasma including an etching reactant; (b) after (a), depositing a protective film on sidewalls of the feature, the protective film including at least one of a tungsten carbonitride, a tungsten sulfide, tin, a tin-containing compound, molybdenum, a molybdenum-containing compound, a ruthenium carbonitride, a ruthenium sulfide, an aluminum carbonitride, an aluminum sulfide, zirconium, and a zirconium-containing compound; and (c) repeating (a)-(b) until the feature is etched to a final depth, where the protective film deposited in (b) substantially prevents lateral etch of the feature during (a), and where the feature has an aspect ratio of about 5 or greater at its final depth.

In some embodiments, the protective film may include tungsten carbonitride or tungsten sulfide. For example, the protective film may include tungsten carbonitride. In some cases, the protective film may include tin, tin oxide, tin nitride, tin carbide, tin carbonitride, or tin sulfide. For example, the protective film may include tin oxide. In some embodiments, the protective film may include molybdenum, molybdenum oxide, molybdenum carbide, molybdenum nitride, molybdenum carbonitride, or molybdenum sulfide. In various embodiments, protective film may include a metal sulfide. In certain cases, the protective film may include ruthenium carbonitride or ruthenium sulfide. In some embodiments, the protective film may include aluminum carbonitride or aluminum sulfide. In some embodiments, the protective film may include zirconium, zirconium oxide, zirconium carbide, zirconium nitride, zirconium carbonitride, or zirconium sulfide.

In various implementations, (b) may include depositing the protective film through an atomic layer deposition reaction including: (i) exposing the substrate to a first deposition reactant and allowing the first deposition reactant to adsorb onto the sidewalls of the feature; and (ii) after (i), exposing the substrate to a second deposition reactant and reacting the first and second deposition reactants in a surface reaction, thereby forming the protective film on the sidewalls of the feature. In some other implementations, (b) may include depositing the protective film through a chemical vapor deposition reaction including exposing the substrate to a first deposition reactant and a second deposition reactant simultaneously.

The method may further include doping a mask layer on the dielectric-containing stack prior to (a). In some implementations, (a) may result in formation of a fluorocarbon-based coating on the sidewalls of the feature, the method further including after (a) and before (b), pre-treating the substrate to thereby remove or alter the fluorocarbon-based coating, and where pre-treating the substrate includes exposing the substrate to plasma generated from either (i) a gas including N2 and H2, or (ii) a gas including O2 and inert gas. In some such cases, the protective film may include tungsten carbonitride. In some embodiments, (a) may result in formation of a fluorocarbon-based coating on the sidewalls of the feature, the protective film may include tin oxide, and the tin oxide protective film is deposited in (b) directly on the fluorocarbon-based coating formed in (a).

In some embodiments, the method may further include removing the protective film from the sidewalls after the feature is fully etched. In various implementations, the protective film may include tungsten carbonitride and may be removed by exposing the substrate to H2O2, SC1, or a plasma generated from a gas including Cl2O2. In some cases, the method may further include exposing the substrate to oxidizing conditions after the feature is fully etched to thereby oxidize any remaining protective film on the sidewalls of the feature.

In another aspect of the embodiments herein, an apparatus is provided, the apparatus including a controller configured to cause any of the methods described herein. For example, an apparatus for forming an etched feature in a dielectric-containing stack on a semiconductor substrate is provided, the apparatus including: one or more reaction chambers, where at least one reaction chamber is designed or configured to perform etching, and where at least one reaction chamber is designed or configured to perform deposition, each reaction chamber including: an inlet for introducing process gases to the reaction chamber, and an outlet for removing material from the reaction chamber, and a controller having instructions for causing: (a) partially etching the feature in the dielectric-containing stack by exposing the substrate to a first plasma including an etching reactant, where (a) is performed in the reaction chamber designed or configured to perform etching; (b) after (a), depositing a protective film on sidewalls of the feature, where the protective film includes at least one of a tungsten carbonitride, a tungsten sulfide, tin, a tin-containing compound, molybdenum, and a molybdenum-containing compound, and where (b) is performed in the reaction chamber designed or configured to perform deposition; and (c) repeating (a)-(b) until the feature is etched to a final depth, where the protective film deposited in (b) substantially prevents lateral etch of the feature during (a), and where the feature has an aspect ratio of about 5 or greater at its final depth.

In certain implementations, the reaction chamber designed or configured to perform etching may be the same reaction chamber designed or configured to perform deposition, such that both (a) and (b) occur in the same reaction chamber. In other implementations, the reaction chamber designed or configured to perform etching may be different from the reaction chamber designed or configured to perform deposition, and the controller may further include instructions to transfer the substrate under vacuum conditions between the reaction chamber designed or configured to perform etching and the reaction chamber designed or configured to perform deposition.

These and other features will be described below with reference to the associated drawings.

BRIEF DESCRIPTION OF THE DRAWINGS

FIGS. 3A-3C depict partially fabricated semiconductor devices as features are etched over time according to certain embodiments.

DETAILED DESCRIPTION

I. Technology for Etching High Aspect Ratio Features in a Dielectric Material

Fabrication of certain semiconductor devices involves etching features into a dielectric material or materials. The dielectric material may be a single layer of material or a stack of materials. In some cases a stack includes alternating layers of dielectric material (e.g., silicon nitride and silicon oxide). One example etched feature is a cylinder, which may have a high aspect ratio. As the aspect ratio of such features continues to increase, it is increasingly challenging to etch the features into dielectric materials. One problem that arises during etching of high aspect ratio features is a non-uniform etching profile. In other words, the features do not etch in a straight downward direction. Instead, the sidewalls of the features are often bowed such that a middle portion of the etched feature is wider (i.e., further etched) than a top and/or bottom portion of the feature. This over-etching near the middle portion of the features can result in compromised structural and/or electronic integrity of the remaining material. For example, bowing and twisting of the feature can lead to shorts or interference between neighboring memory strings.

Without being bound by any theory or mechanism of action, it is believed that the over-etching at the middle portion of the cylinder or other feature occurs at least partially because the sidewalls of the feature are insufficiently protected from etching. Conventional etch chemistry utilizes fluorocarbon etchants to form the features in the dielectric material. The fluorocarbon etchants are excited by plasma exposure, which results in the formation of various fluorocarbon fragments including, for example, CF, $CF_2$, and $CF_3$. Reactive fluorocarbon fragments etch away the dielectric material at the bottom of the feature with the assistance of ions. Other fluorocarbon fragments are deposited on the sidewalls of the feature as it is etched, thereby forming a protective polymeric fluorocarbon-based sidewall coating. This protective sidewall coating promotes preferential etching at the bottom of the feature as opposed to the sidewalls of the feature. Without this sidewall protection, the feature begins to assume a non-uniform profile, with a wider etch/feature width where the sidewall protection is inadequate.

Figure 1:
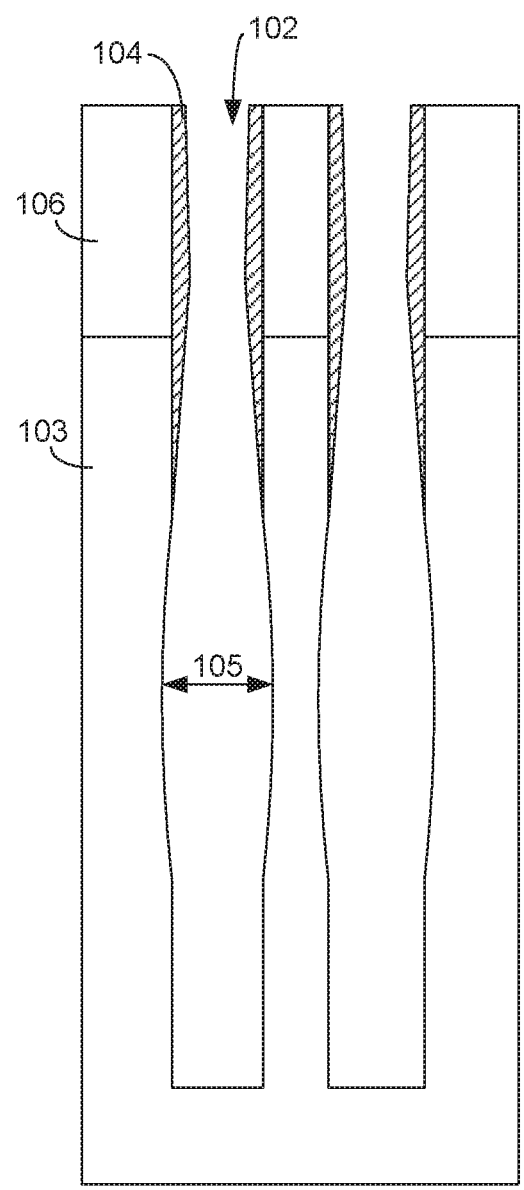
FIG. 1 illustrates an etched cylinder having an undesirable bow due to over-etching of the sidewalls.

Sidewall protection is especially difficult to achieve in high aspect ratio features. One reason for this difficulty is that existing fluorocarbon-based processes cannot form the protective polymeric sidewall coating deep in the cylinder being etched. FIG. 1 presents a figure of a cylinder 102 being etched in a dielectric material 103 coated with a patterned mask layer 106. While the following discussion sometimes refers to cylinders, the concepts apply to other feature shapes such as trenches, rectangles, and other polygons. A protective polymeric sidewall coating 104 is concentrated near the top portion of the cylinder 102. $C_xF_y$ chemistry provides both the etch reactant(s) for etching the cylinder vertically, as well as the reactant(s) that form the protective polymeric sidewall coating 104. Because the protective polymeric sidewall coating 104 does not extend deep into the cylinder (i.e., there is insufficient deposition on the sidewall), the middle portion of the cylinder 102 becomes wider than the top portion of the cylinder 102. The wider middle portion of the cylinder 102 is referred to as the bow 105. The bow can be numerically described in terms of a comparison between the critical dimension of the feature at the bow region (the relatively wider region) and the critical dimension of the feature below the bow region. The bow may be numerically reported in terms of distance (e.g., the critical dimension at the widest part of the feature minus the critical dimension at the narrowest part of the feature below the bow) or in terms of a ratio/percent (the critical dimension at the widest part of the feature divided by the critical dimension at the narrowest part of the feature below the bow). This bow 105, and the related non-uniform etch profile, is undesirable. Because of the high ion energies often used in this type of etching process, bows are often created when etching cylinders of high aspect ratios. In some applications, bows are created even at aspect ratios as low as about 5. As such, conventional fluorocarbon etch chemistry is typically limited to forming relatively low aspect ratio cylinders in dielectric materials. Some modern applications require cylinders having higher aspect ratios than those that can be achieved with conventional etch chemistry.

II. Context and Applications

In various embodiments herein, features are etched in a substrate (typically a semiconductor wafer) having dielectric material on the surface. The etching processes are generally plasma-based etching processes. The overall feature formation process may occur in stages: one stage directed at etching the dielectric material and another stage directed at forming a protective sidewall coating without substantially etching the dielectric material. The protective sidewall coating passivates the sidewalls and prevents the feature from being over-etched (i.e., the sidewall coating prevents lateral etch of the feature). These two stages can be repeated until the feature is etched to its final depth. By cycling these two stages, the diameter of the feature can be controlled over the entire depth of the feature, thereby forming features having more uniform diameters/improved profiles. Additional stages may involve treating the sidewall surfaces after partially etching the feature and prior to depositing the protective sidewall coating, as well as removing or treating any protective sidewall coating after the feature is fully etched. In some cases, the mask layer may be doped or otherwise treated prior to etching the feature.

In a number of embodiments herein, the protective sidewall coating is a metal-containing film having a particular composition. Metal-containing films such as the ones described herein have been shown to provide improved etch resistance/sidewall protection compared to other types of film such as silicon oxide, boron nitride, hydrocarbon polymers, and certain other types of metal or metal-containing layers. Experimental results illustrating the improved etch results are shown in the Experimental section below.

Certain metal-containing films can be advantageous as protective sidewall coatings because some such films have a higher electrical conductivity, as compared to dielectric films. Without being limited to the following explanations, it is believed that higher electrical conductivity reduces the risk of experiencing unwanted electrical charging effects within the partially etched feature during the etch process. During an etch process, a potential difference can develop between the top and bottom of a partially etched feature. This potential difference may act to repel ions such that a percentage of the ions do not travel as desired to the bottom of a feature. For example, ions that would otherwise travel to the bottom of a feature may be repelled either (a) away from the feature, such that the ion does not etch the feature, or (b) into a sidewall of the feature, such that the sidewall becomes over-etched, leading to an undesirable bow in the feature and a reduced vertical etch rate. By contrast, where a more conductive metal-containing film is used as a protective sidewall coating, the more conductive film may enable charges within the feature to dissipate such that there is no potential difference (or only a minimal potential difference) between different portions of the recessed feature during etching. This reduces the likelihood that ions will be undesirably repelled, leading to an improved profile and/or increased vertical etch rate.

Another reason that certain metal-containing films might be beneficial in various implementations is that they can provide a different sidewall surface, as compared to other types of sidewall protection films, during the etching operation. This may lead to different surface chemical reactivity and catalysis on the sidewall surfaces during etching. One result may be that the set of species that reach the bottom of the feature is different than the set of species that would reach the bottom of the feature using other types of protective sidewall films. For example, a metal-containing film may result in a different speciation of neutral atoms and molecules reaching the bottom of the feature, which may have positive impacts in terms of etch rate, etch profile, striations, and distortion.

Further, certain metal-containing films may be deposited with a desired degree of conformality in many cases. Various metal-containing films can be deposited with higher conformality than silicon oxide and many other silicon-containing and boron-containing films. This improved conformality is advantageous at least because it decreases the likelihood that the top of the feature will become blocked during the deposition stages. Further, the conformality of such films can be tuned to target deposition of the protective sidewall coating to a desired depth. This tuning can ensure that the protective sidewall coating forms at the bow region, thus preventing the bow from developing in the first place. This also ensures that the protective sidewall coating is relatively thinner or non-existent at very deep depths (e.g., near the feature bottom, below the bow region), which allows the feature to continue etching vertically downwards into the dielectric material.

The embodiments herein are particularly useful for enabling deeper etches. Previously, the maximum etch depth achievable was limited by the bow that develops during etching. The protective films described herein reduce or eliminate such bowing, thereby allowing for etching of deeper features. Further, the embodiments herein enable increased device packing density, meaning that the number of devices formed on an individual semiconductor substrate can be maximized. The reduction or elimination of bowing enables the features to be formed closer together while still maintaining structural and electrical integrity.

A feature is a recess in the surface of a substrate. Features can have many different shapes including, but not limited to, cylinders, rectangles, squares, other polygonal recesses, trenches, etc.

Aspect ratios are a comparison of the depth of a feature to the critical dimension of the feature (often its width/diameter). For example, a cylinder having a depth of 2 μm and a width of 50 nm has an aspect ratio of 40:1, often stated more simply as 40. Since the feature may have a non-uniform critical dimension over the depth of the feature, the aspect ratio can vary depending on where it is measured. For instance, sometimes an etched cylinder may have a middle portion that is wider than the top and bottom portions. This wider middle section may be referred to as the bow, as noted above. An aspect ratio measured based on the critical dimension at the top of the cylinder (e.g., the neck) would be higher than an aspect ratio measured based on the critical dimension at the wider middle/bow of the cylinder. As used herein, aspect ratios are measured based on the critical dimension proximate the opening of the feature, unless otherwise stated.

The features formed through the disclosed methods may be high aspect ratio features. In some applications, a high aspect ratio feature is one having an aspect ratio of at least about 5, at least about 10, at least about 20, at least about 30, at least about 40, at least about 50, at least about 60, at least about 80, or at least about 100. The critical dimension of the features formed through the disclosed methods may be about 200 nm or less, for example about 100 nm or less, about 50 nm or less, or about 20 nm or less. In some cases, the feature has a CD between about 80-100 nm throughout the entire feature.

The material into which the feature is etched may be a dielectric material in various cases. Example materials include, but are not limited to, silicon oxides, silicon nitrides, silicon carbides, oxynitrides, oxycarbides, carbonitrides, doped versions of these materials (e.g., doped with boron, phosphorus, etc.), and laminates from any combinations of these materials. Particular example materials include stoichiometric and non-stoichiometric formulations of $SiO_2$, SiN, SiON, SiOC, SiCN, etc. The material or materials being etched may also include other elements, for example hydrogen in various cases. In some embodiments, a nitride and/or oxide material being etched has a composition that includes hydrogen. As used herein, it is understood that silicon oxide materials, silicon nitride materials, etc. include both stoichiometric and non-stoichiometric versions of such materials, and that such materials may have other elements included, as described above.

One application for the disclosed methods is in the context of forming a DRAM device. In this case, the feature may be etched primarily in silicon oxide. The substrate may also include one, two, or more layers of silicon nitride, for instance. In one example, a substrate includes a silicon oxide layer sandwiched between two silicon nitride layers, with the silicon oxide layer being between about 800-1200 nm thick and one or more of the silicon nitride layers being between about 300-400 nm thick. The etched feature may be a cylinder having a final depth between about 1-3 µm, for example between about 1.5-2 µm. The cylinder may have a width between about 20-50 nm, for example between about 25-30 nm. After the cylinder is etched, a capacitor memory cell can be formed therein.

Another application for the disclosed methods is in the context of forming a vertical NAND (VNAND, also referred to as 3D NAND) device. In this case, the material into which the feature is etched may have a repeating layered structure. For instance, the material may include alternating layers of oxide (e.g., $SiO_2$) and nitride (e.g., SiN), or alternating layers of oxide (e.g., $SiO_2$) and polysilicon. The alternating layers form pairs of materials. In some cases, the number of pairs may be at least about 20, at least about 30, at least about 40, at least about 60, or at least about 70. The oxide layers may have a thickness between about 20-50 nm, for example between about 30-40 nm. The nitride or polysilicon layers may have a thickness between about 20-50 nm, for example between about 30-40 nm. The feature etched into the alternating layer may have a depth between about 2-6 µm, for example between about 3-5 µm. The feature may have a width between about 50-150 nm, for example between about 50-100 nm.

III. Etching/Deposition Process

Figure 2:
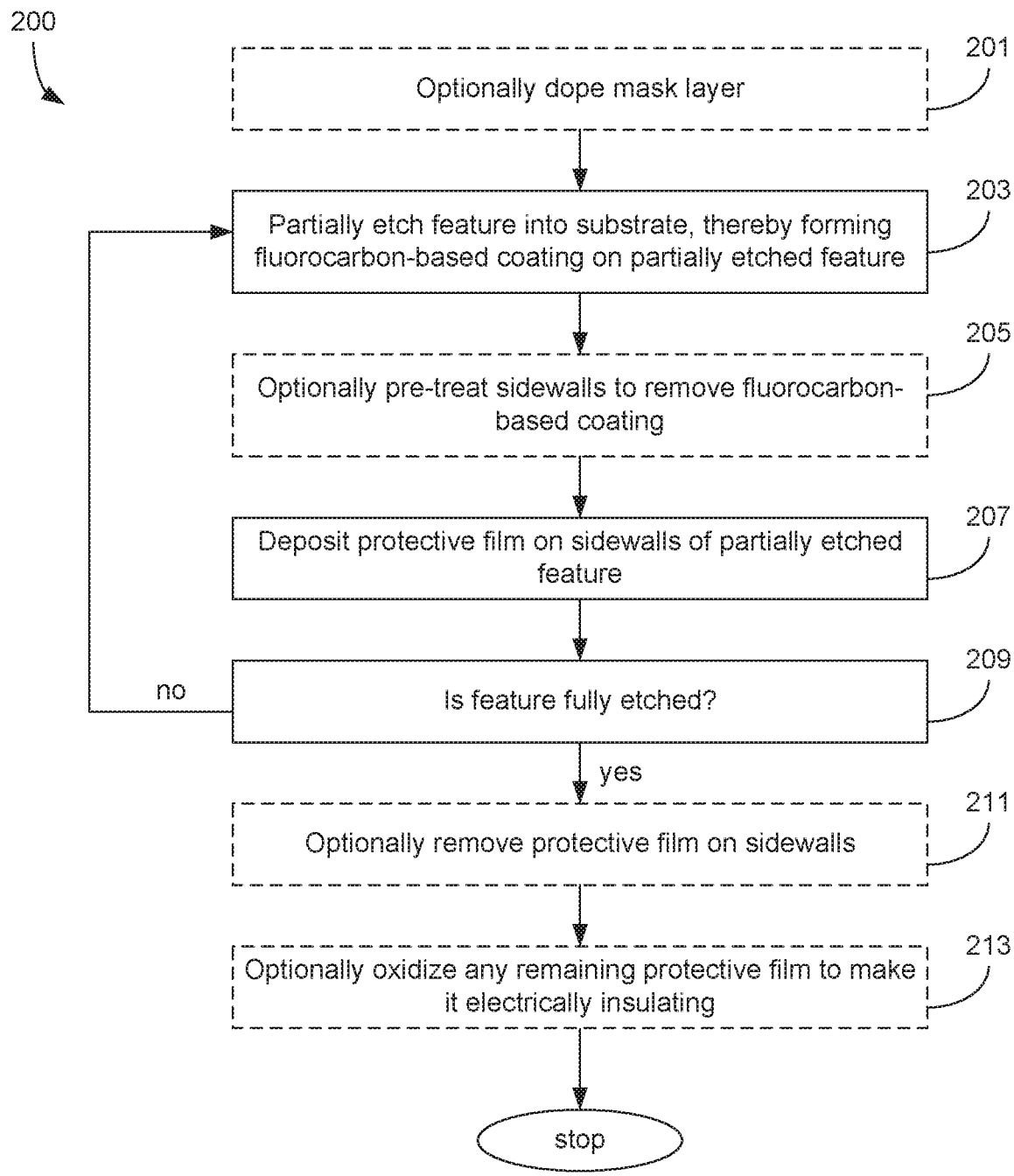
FIG. 2 is a flowchart describing a method of etching a feature in dielectric material according to certain embodiments.

FIG. 2 presents a flowchart for a method of forming an etched feature in a semiconductor substrate. The operations shown in FIG. 2 are described in relation to FIGS. 3A-3C, which show a partially fabricated semiconductor substrate as the feature is etched. The substrate includes dielectric material 303 covered by a mask layer 306. The dielectric material 303 may include alternating layers of material, for example alternating layers of silicon oxide and silicon nitride, or alternating layers of silicon oxide and polysilicon, as mentioned above.

At operation 201, the mask layer 306 is optionally doped. In many cases, the mask layer 306 may be carbon (e.g., amorphous carbon). In various cases the mask layer 306 may be doped with a metal. Example dopants include, but are not limited to, tungsten, boron, tin, molybdenum, ruthenium, aluminum, zirconium, and combinations thereof. In some embodiments, the mask layer 306 is doped with a metal that is the same as a metal used in the protective sidewall coating. In one example, the mask layer 306 is doped with tungsten, and a later deposited protective sidewall film (e.g., protective film 310 as shown in FIGS. 3B and 3C) is tungsten carbonitride (WCN) or tungsten sulfide (WS). In another example, the mask layer 306 is doped with tin, and a later deposited protective sidewall film (e.g., protective film 310 in FIGS. 3B and 3C) is tin (Sn), tin oxide ($SnO_x$), tin nitride (SnN), tin carbide (SnC), tin carbonitride (SnCN), tin sulfide (SnS), or a combination thereof. In another example, the mask layer 306 is doped with molybdenum, and a later deposited protective sidewall film (e.g., protective film 310 in FIGS. 3B and 3C) is molybdenum (Mo), molybdenum oxide ($MoO_x$), molybdenum carbide (MoC), molybdenum nitride (MoN), molybdenum carbonitride (MoCN), molybdenum sulfide (MoS), or a combination thereof.

Doping the mask layer 306 may make the mask layer more resistant to etching. This may allow for thinner mask layers and/or formation of deeper features. In many cases, the feature depth is limited by the rate at which the mask layer 306 is eroded during etching. Once the mask layer 306 is sufficiently eroded, it is not possible to etch the feature deeper without damage to the remaining structures. Therefore, increasing the etch resistance of the mask layer 306 allows for formation of deeper features, since the mask layer is eroded more slowly and etching can continue for a longer duration.

Next, at operation 203, a feature 302 is etched to a first depth, as shown in FIG. 3A. This first depth is only a fraction of the final desired depth of the feature. The chemistry used to etch the feature may be a fluorocarbon-based chemistry ($C_xF_y$). Other etch chemistries may be used. This etching operation 201 may result in formation of a fluorocarbon-based coating 304. The fluorocarbon-based coating 304 may be a polymeric sidewall coating, as described with relation to FIG. 1. The fluorocarbon-based coating 304 extends toward the first depth, though in many cases the fluorocarbon-based coating 304 does not actually reach the bottom of the feature 302. Example processing conditions for etching the substrate are further discussed below.

The fluorocarbon-based coating 304 indirectly forms from the $C_xF_y$ etching chemistry as certain fluorocarbon species/fragments deposit on the sidewalls of the feature (e.g., certain fluorocarbon species are precursors for the fluorocarbon-based coating 304). One reason that the fluorocarbon-based coating 304 does not reach the bottom of the feature 302 may relate to the sticking coefficient of the precursors that form the coating. In particular, it is believed that for certain etchants the sticking coefficient of the fluorocarbon fragments is too high, which causes the substantial majority of the fluorocarbon fragments to attach to the sidewalls soon after entering the feature. As such, the resulting fluorocarbon-based 304 coating is not able to penetrate deep into the feature where sidewall protection is needed (e.g., at the region where the bow would form). The fluorocarbon-based coating 304 therefore provides only partial protection against over-etching of the sidewalls of the feature 302. In some implementations, the etch conditions provide little, if any, sidewall protection.

Next, at operation 205 the sidewalls of the feature are optionally pre-treated to remove or otherwise treat the fluorocarbon-based coating 304. While FIGS. 3B and 3C show the fluorocarbon-based coating 304 remaining on the sidewalls, it is understood that in some cases this fluorocarbon-based coating 304 may be removed. In some cases, pre-treating the sidewalls includes exposing the substrate to plasma. In a particular example, the plasma includes a mixture of $N_2/H_2$. Such a plasma may be effective in removing the fluorocarbon-based coating 304, or at a minimum, removing the fluorine from this material. Other example pre-treatments may include exposing the substrate to plasma generated from a mixture of $O_2$ with inert gas such as argon. Example processing conditions for removing the fluorocarbon-based coating 304 are provided below.

Surprisingly, in some cases removing the fluorocarbon-based coating 304 actually results in improved sidewall protection during future etching steps. This improved protection may be because the protective film 310 (described further below) does not nucleate well on the fluorocarbon-based material of the fluorocarbon-based coating 304. In such cases, it is advantageous to remove the fluorocarbon-based coating 304 to provide a more desirable surface on which to form the protective film 310. In other cases, sidewall protection may be optimized by allowing the first sidewall coating 310 to remain on the sidewalls. In these cases, the second sidewall coating is deposited directly on the fluorocarbon-based coating 304. In some such cases, the fluorocarbon-based coating 304 and protective film 310 together form a material that is harder and more etch resistant than either material alone.

In one example where the fluorocarbon-based coating 304 is not removed, the protective film 310 may include tin. For instance, the protective film 310 may be tin, tin oxide, tin nitride, tin carbide, tin carbonitride, tin sulfide, or a combination thereof. Some such materials (e.g., tin oxide) have been shown to work synergistically with the fluorocarbon-based materials of the fluorocarbon-based coating 304 to provide high quality sidewall passivation and etching results. In another example where the fluorocarbon-based coating 304 is removed, the protective film 310 may include tungsten. For instance, the protective film 310 may be tungsten, tungsten carbonitride, tungsten nitride, tungsten carbide, tungsten oxide, tungsten sulfide, or a combination thereof. In a particular example the protective film 310 is tungsten carbonitride.

Next, at operation 207, the protective film 310 is deposited on sidewalls of the partially etched feature (in some cases on the fluorocarbon-based coating 304). This deposition may occur through various reaction mechanisms including, but not limited to, chemical vapor deposition (CVD) methods and atomic layer deposition (ALD) methods (either of which may or may not be plasma-assisted). ALD methods are particularly well suited for forming films with tunable conformality to deposit the protective film 310 at a desired depth. For instance, ALD methods are useful for delivering reactants down to a desired depth due to the adsorption-driven nature of such methods. CVD and other deposition processes may be suitable in various implementations, particularly where the deposition can be carried out with tunable conformality. Processing conditions for depositing the protective film 310 are provided below.

As mentioned above, in a number of implementations the protective film 310 may be a metal-containing film having a particular composition. Certain metal-containing films have been shown to provide improved etch resistance/sidewall protection compared to other types of films such as silicon oxide. Example metals that may be included in a metal-containing film include, but are not limited to, tungsten, tin, molybdenum, ruthenium, aluminum, zirconium, and combinations thereof. The metal-containing film may further include one or more of nitrogen, carbon, boron, oxygen, sulfur, and hydrogen. In some embodiments, the metal containing film is metallic as in the case of an elemental metal (e.g., elemental tungsten, elemental tin, elemental molybdenum, elemental ruthenium, elemental aluminum, elemental zirconium, etc).

In some examples, the protective film 310 may include tungsten. Particular examples include tungsten (W), tungsten carbonitride (WCN), tungsten carbide (WC), tungsten oxide ($WO_x$), tungsten sulfide (WS), and combinations thereof. In one example, the protective film is WCN, WS, or a combination thereof. In a particular example the protective film is WS. In some examples, the protective film 310 may include tin. Particular examples include tin (Sn), tin oxide ($SnO_x$), tin nitride (SnN), tin carbide (SnC), tin carbonitride (SnCN), tin sulfide (SnS), and combinations thereof. In some examples, the protective film 310 may include molybdenum. Particular examples include molybdenum (Mo), molybdenum oxide ($MoO_x$), molybdenum carbide (MoC), molybdenum nitride (MoN), molybdenum sulfide (MoS), molybdenum carbonitride (MoCN), and combinations thereof. In some examples, the protective film 310 may include ruthenium. Particular examples include ruthenium (Ru), ruthenium oxide ($RuO_x$), ruthenium carbide (RuC), ruthenium nitride (RuN), ruthenium sulfide (RuS), ruthenium carbonitride (RuCN), and combinations thereof. In a particular example the protective film 310 is RuCN or RuS. In one example the protective film 310 is RuS. In some examples, the protective film 310 may include aluminum. Particular examples include aluminum (Al), aluminum oxide ($AlO_x$), aluminum carbide (AlC), aluminum nitride (AN), aluminum sulfide (AlS), aluminum carbonitride (AlCN), and combinations thereof. In a particular example the protective film 310 is AlCN or AlS. In one example the protective film 310 is AlS. In some examples, the protective film 310 may include zirconium. Particular examples include zirconium (Zr), zirconium oxide ($ZrO_x$), zirconium nitride (ZrN), zirconium carbide (ZrC), zirconium carbonitride (ZrCN), zirconium sulfide (ZrS), and combinations thereof.

Various materials described above have been shown to provide excellent sidewall protection during etching. It is expected that these materials provide superior sidewall protection compared to various other metal-containing films.

Next, at operation 209 it is determined whether the feature is fully etched. After the first iteration of operations 201-209, the feature is not fully etched, and the method repeats starting with operation 203. Operations 203-209 are repeated until the feature is fully etched.

In various embodiments, one or more processing condition may change between different iterations of one or more of the operations. For example, different iterations of operation 203 may use different etch chemistry, different plasma conditions (e.g., higher or lower RF power, higher or lower RF frequency, higher or lower plasma duty cycle, etc.), different timing, different pressure, different substrate temperature, and/or different reactant vaporization temperature, etc. Similarly, different iterations of operation 205 may use different pre-treatment chemistry, different plasma conditions (e.g., higher or lower RF power, higher or lower RF frequency, higher or lower plasma duty cycle, etc.), different timing, different pressure, and/or different substrate temperature, etc. In some cases, operation 205 may be practiced in some iterations but omitted in other iterations. Different iterations of operation 207 may similarly use different deposition chemistry, different deposition mechanism, different plasma conditions (e.g., higher or lower RF power, higher or lower RF frequency, higher or lower plasma duty cycle, etc.), different timing, different pressure, different substrate temperature, and/or different reactant vaporization temperature, etc.

One reason for changing one or more processing conditions between different iterations is to tune the conformality of the protective film 310. The shape of the feature changes as it is etched more deeply into the dielectric material. As a result, the optimal location/depth for the protective film also changes. It is advantageous to target the protective film at the region where the bow starts to form (or would start to form, if allowed). At the bow region, the protective film may be deposited to be relatively thicker, and at depths lower than the bow region, the protective film may be relatively thinner or non-existent. This difference in thickness may allow the bottom of the feature to be etched/opened as desired, thereby forming more vertical sidewalls. In order to achieve this result, the deposition conditions can be tuned during each iteration of operation 207 such that the protective film forms to a desired depth each time it is deposited.

In one example where the protective film is deposited through atomic layer deposition, the depth to which the protective film forms may be tuned by controlling the dose of precursor. For instance, lower precursor flow rates, shorter precursor dose times, lower pressure, and lower vaporizer temperature (e.g., for liquid phase reactants that are vaporized prior to delivery) each result in relatively less precursor available for adsorption onto the substrate, and therefore result in protective films that do not extend as deep into the feature. By contrast, higher precursor flow rates, longer precursor dose times, higher pressure, and higher vaporizer temperature each result in relatively more precursor available for adsorption onto the substrate, and therefore result in protective films that extend more deeply into the feature. In another example where the protective film is deposited through chemical vapor deposition, the depth to which the protective film forms may be tuned by controlling the plasma conditions, such as the RF power. At higher RF power, there could be more disassociation of the precursor species and hence the protective film forms more deeply and more conformally. By contrast, at lower RF power, the protective film forms less deeply and less conformally. Deposition mechanisms other than ALD and CVD may be used in various cases. In various embodiments, the protective film forms at increasingly deep depths within the feature as additional iterations are performed and the feature is etched more deeply into the dielectric material 303.

In various embodiments, the etching operation 203 and the protective film deposition operation 207 are cyclically repeated a number of times, as discussed above. For instance, these operations may each occur at least twice, for example at least three times, or at least 5 times. In some cases, the number of cycles (each cycle including etching operation 203 and protective film deposition operation 207) is between about 2-10, for example between about 2-5. Each time the etching operation occurs, the etch depth increases. The distance etched may be uniform between cycles, or it may be non-uniform. In certain embodiments, the distance etched in each cycle decreases as additional etches are performed (e.g., later performed etching operations may etch less extensively than earlier performed etching operations). The thickness of the protective film 310 deposited in each deposition operation 207 may be uniform between cycles, or the thickness of such coatings may vary. Example thicknesses for the protective film 310 during each cycle may range between about 1-10 nm, for example between about 3-5 nm. Further, the type of coating that is formed may be uniform between the cycles, or it may vary.

Returning to FIG. 2, once the feature is fully etched, the method continues with operation 211, where the protective film is optionally removed from the sidewalls of the feature. The protective film may be removed through wet cleaning methods or dry cleaning methods (e.g., plasma cleaning methods). Removal of the protective film may be beneficial in certain embodiments. In various cases, it may be advantageous to ensure that there is little or no electrically conductive material remaining in the feature. Such conductive material may undesirably form shorts between different layers in the device, for example. Further, such material may be problematic in future processing steps, which may be taken to line and/or fill the feature with a desired material. Example processing conditions for removing the protective film are further discussed below.

At operation 213, any remaining protective film within the feature may be optionally oxidized. This step may form an electrically insulating metal oxide on the sidewalls (e.g., $WO_x$, $SnO_x$, $MoO_x$, $RuO_x$, $AlO_x$, or $ZrO_x$). As discussed in relation to operation 211, it may be advantageous in various embodiments to ensure that no conductive material remains in the feature after etching. Conversion of any remaining protective film material to an electrically insulating metal oxide material ensures that no electrically conductive material remains in the feature. Example processing conditions for oxidizing the remaining protective film are further discussed below. After operation 213, the method is complete.

The etching operation 203 and the deposition operation 207 may occur in the same reaction chamber or in different reaction chambers. In one example, the etching operation 203 occurs in a first reaction chamber and the deposition operation 207 occurs in a second reaction chamber, with the first and second reaction chambers together forming a multi-chamber processing apparatus such as a cluster tool. Load-locks and other appropriate vacuum seals may be provided for transferring the substrate between the relevant chambers in certain cases. The substrate may be transferred by a robot arm or other mechanical structure. A reaction chamber used for etching may be a Flex™ reaction chamber, for example from the 2300® Flex™ product family available from Lam Research Corporation of Fremont, Calif. A reaction chamber used for deposition may be chamber from the Vector® product family or the Altus® product family, both available from Lam Research Corporation. The use of a combined reactor for both etching and deposition may be beneficial in certain embodiments as the need to transfer the substrate is avoided. The use of different reactors for etching and deposition may be beneficial in other embodiments where it is desired that the reactors are particularly optimized for each operation. The relevant reaction chambers are discussed further below.

As noted, the deposition operation helps optimize the etching operation by forming a protective layer at a desired conformality and depth that minimizes or prevents lateral etch of the feature during the etching operation. This promotes formation of etched features having very vertical sidewalls with little or no bowing. In certain implementations, a final etched feature having an aspect ratio of at least about 80 has a bow less than about 60% (measured as the widest critical dimension-narrowest critical dimension below that/narrowest critical dimension below that *100). For example, a feature having a widest CD of 50 nm and a narrowest CD of 40 nm (the 40 nm CD being positioned below the 50 nm CD in the feature) has a bow of 25% (100*(50 nm−40 nm)/40 nm=25%).

IV. Materials and Parameters of the Process Operations

A. Substrate

The methods disclosed herein are particularly useful for etching semiconductor substrates having dielectric materials thereon. Example dielectric materials include silicon oxides, silicon nitrides, silicon carbides, oxynitrides, oxycarbides, carbo-nitrides, doped versions of these materials (e.g., doped with boron, phosphorus, etc.), and laminates from any combinations of these materials. Particular example materials include stoichiometric and non-stoichiometric formulations of $SiO_2$, SiN, SiON, SiOC, SiCN, etc. As noted above, the dielectric material that is etched may include more than one type/layer of material. In particular cases, the dielectric material may be provided in alternating layers of SiN and $SiO_2$ or alternating layers of polysilicon and $SiO_2$. Further details are provided above. The substrate may have an overlying mask layer that defines where the features are to be etched. In certain cases, the mask layer is carbon or silicon. Example thicknesses for the mask may be between about 500-1500 nm.

B. Etching Process

In various embodiments, the etching process is a reactive ion etch process that involves flowing a chemical etchant into a reaction chamber (often through a showerhead), generating a plasma from, inter alia, the etchant, and exposing a substrate to the plasma. The plasma dissociates the etchant compound(s) into neutral species and ion species (e.g., charged or neutral materials such as CF, $CF_2$ and $CF_3$). The plasma is a capacitively coupled plasma in many cases, though other types of plasma may be used as appropriate. Ions in the plasma are directed toward the wafer and cause the dielectric material to be etched away upon impact.

Example apparatus that may be used to perform the etching process include the 2300® FLEX™ product family of reactive ion etch reactors available from Lam Research Corporation of Fremont, Calif. This type of etch reactor is further described in the following U.S. patents, each of which is herein incorporated by reference in its entirety: U.S. Pat. Nos. 8,552,334, and 6,841,943.

Various reactant options are available to etch the features into the dielectric material. In certain cases, the etching chemistry includes one or more fluorocarbons. In these or other cases, the etching chemistry may include other etchants such as $NF_3$. One or more co-reactants may also be provided. In some cases oxygen ($O_2$) or another oxidant is provided as a co-reactant. The oxygen may help moderate formation of a protective polymer sidewall coating (e.g., the fluorocarbon-based coating 304 of FIGS. 3A-3C).

In certain implementations, the etching chemistry includes a combination of fluorocarbons and oxygen. For instance, in one example the etching chemistry includes $C_4F_6$, $C_4F_8$, $NF_3$, CO, $CF_4$, and $O_2$. Other conventional etching chemistries may also be used, as may non-conventional chemistries. The fluorocarbons may flow at a rate between about 0-500 sccm, for example between about 10-200 sccm. Where $C_4F_6$ and $C_4F_8$ are used, the flow of $C_4F_6$ may range between about 10-200 sccm and the flow of $C_4F_8$ may range between about 10-200 sccm. The flow of oxygen may range between about 0-500 sccm, for example between about 10-200 sccm. The flow of $NF_3$ may range between about 0-500 sccm, for example between about 10-200 sccm. The flow of tetrafluoromethane may range between about 0-500 sccm, for example between about 10-200 sccm. The flow of carbon monoxide may range between about 0-500 sccm, for example between about 10-200 sccm. These rates are appropriate in a reactor volume of approximately 50 liters that is used to process a single 300 mm wafer. The flow rates herein may be scaled as appropriate for reactors of different sizes, and may be scaled linearly based on substrate area for substrates of other sizes.

In some embodiments, the substrate temperature during etching is between about 0-100° C. In some embodiments, the pressure during etching is between about 10-50 mTorr. The ion energy may be relatively high, for example between about 1-10 kV. The ion energy is determined by the applied RF power. In various cases, dual-frequency RF power is used to generate the plasma. Thus, the RF power may include a first frequency component (e.g., about 2 MHz) and a second frequency component (e.g., about 60 MHz). Different powers may be provided at each frequency component. For instance, the first frequency component (e.g., about 2 MHz) may be provided at a power between about 3-15 kW, for example about 10 kW, and the second frequency component (e.g., about 60 MHz) may be provided at a lower power, for example between about 0.5-6 kW, for example about 4 kW. These power levels assume that the RF power is delivered to a single 300 mm wafer. The power levels can be scaled linearly based on substrate area for additional substrates and/or substrates of other sizes (thereby maintaining a uniform power density delivered to the substrate).

Each cycle of the etching process etches the dielectric material to some degree. The distance etched during each cycle may be between about 10-500 nm, for example between about 50-200 nm. The total etch depth will depend on the particular application. For some cases (e.g., DRAM) the total etch depth may be between about 1.5-2 µm. For other cases (e.g., VNAND) the total etch depth may be at least about 3 µm, for example at least about 4 µm, or at least about 8 µm, or at least about 10 µm. In these or other cases, the total etch depth may be about 15 µm or less.

As explained in the discussion of FIGS. 3A-3C, the etching process can produce a fluorocarbon-based coating 304. However, the depth of this fluorocarbon-based coating may be limited to the area near the upper portion of the feature, and may not extend into the feature where the sidewall protection is most needed. Thus, a separate deposition operation is performed, as described herein, to form a protective film that is targeted at the region where the bow would otherwise form.

C. Deposition Process

The deposition process is performed primarily to deposit a protective layer on the sidewalls within the etched features. This protective layer should extend to a desired depth within the feature, even in high aspect ratio features. Formation of the protective layer at desired locations within the feature may be enabled by reactants that have relatively low sticking coefficients, and/or by controlling the precursor dose factors. Further, reaction mechanisms that rely on adsorption-limited deposition (e.g., ALD reactions) can promote formation of the protective layer at desired locations within the feature. Deposition of the protective layer begins after the feature is partially etched. As noted in the discussion of FIG. 2, the deposition operation may be cycled with the etching operation to form additional sidewall protection as the feature is etched deeper into the dielectric material.

In some cases, deposition of the protective layer begins at or after the feature is etched to at least about ⅓ of its final depth. In some embodiments, deposition of the protective layer begins once the feature reaches an aspect ratio of at least about 2, at least about 5, at least about 10, at least about 15, at least about 20, or at least about 30. In these or other cases, the deposition may begin before the feature reaches an aspect ratio of about 4, about 10, about 15, about 20, about 30, about 40, or about 50. In some embodiments, deposition begins after the feature is at least about 1 µm deep, or at least about 1.5 µm deep (e.g., in VNAND embodiments where the final feature depth is 3-4 µm). In other embodiments, deposition begins after the feature is at least about 600 nm deep, or at least about 800 nm deep (e.g., in DRAM embodiments where the final feature depth is 1.5-2 µm deep). The optimal time for initiating deposition of the protective layer is immediately before the sidewalls would otherwise become overetched to form a bow. The exact timing of this occurrence depends on the shape of the feature being etched, the material being etched, the chemistry used to etch and to deposit the protective layer, and the process conditions used to etch and deposit the relevant materials.

The protective layer that forms during the deposition process may have a particular composition. As explained, the protective layer should penetrate deep into an etched feature, and should be relatively resistant to the etching chemistry used to etch the feature. In various cases, the protective layer may be a metal-containing layer such as one that includes tungsten, tin, and/or molybdenum. Particularly promising materials for the protective layer include WCN, WS, Sn, $SnO_x$, SnN, SnC, SnCN, SnS, Mo, $MoO_x$, MoC, MoN, MoCN, MoS, RuCN, RuS, AlCN, AlS, Zr, ZrC, ZrN, ZrCN, $ZrO_x$, and ZrO. When present on sidewalls of a feature during etching, these materials may exhibit an etch selectivity between about 200:1 and 1000:1. In other words, during etching the dielectric material may be removed at a rate that is 200-1000 times faster than the protective film. In various cases, the protective film exhibits an etch selectivity of at least about 500:1.

Where the protective film includes oxygen, an oxygen-containing reactant may be used. Examples of oxygen-containing reactants include, but are not limited to, oxygen ($O_2$), ozone ($O_3$), nitrous oxide ($N_2O$), nitric oxide (NO), nitrogen dioxide ($NO_2$), dinitrogen trioxide ($N_2O_3$), dinitrogen tetroxide ($N_2O_4$), dinitrogen pentoxide ($N_2O_5$), carbon monoxide (CO), carbon dioxide ($CO_2$), sulfur oxide (SO), sulfur dioxide ($SO_2$), oxygen-containing hydrocarbons ($C_xH_yO_z$), water ($H_2O$), formaldehyde ($CH_2O$), carbonyl sulfide (COS), mixtures thereof, etc.

Where the protective film includes nitrogen, a nitrogen-containing reactant may be used. A nitrogen-containing reactant contains at least one nitrogen, for example, nitrogen ($N_2$), ammonia ($NH_3$), hydrazine ($N_2H_4$), amines (e.g., amines bearing carbon) such as methylamine (CHSN), dimethylamine (($CH_3)_2NH$), ethylamine ($C_2H_5NH_2$), isopropylamine ($C_3H_9N$), t-butylamine ($C_4H_{11}N$), di-t-butylamine ($C_8H_{19}N$), cyclopropylamine ($C_3H_5NH_2$), sec-butylamine ($C_4H_{11}N$), cyclobutylamine ($C_4H_7NH_2$), isoamylamine ($C_5H_{13}N$), 2-methylbutan-2-amine ($C_5H_{13}N$), trimethylamine ($C_3H_9N$), diisopropylamine ($C_6H_{15}N$), diethylisopropylamine ($C_7H_{17}N$), di-t-butylhydrazine ($C_8H_{20}N_2$), as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants. Other examples include $N_xO_y$ compounds such as nitrous oxide ($N_2O$), nitric oxide (NO), nitrogen dioxide ($NO_2$), dinitrogen trioxide ($N_2O_3$), dinitrogen tetroxide ($N_2O_4$) and/or dinitrogen pentoxide ($N_2O_5$).

Where the protective film includes carbon, a carbon-containing reactant may be used. Examples of carbon-containing reactants include, but are not limited to, hydrocarbons ($C_xH_y$) oxygen-containing hydrocarbons ($C_xH_yO_z$), carbonyl sulfide (COS), carbon disulfide ($CS_2$), fluorocarbons ($C_xF_y$), hydrofluorocarbons ($C_xH_yF_z$), etc.

Where the protective film includes sulfur, a sulfur-containing reactant may be used. Examples of sulfur-containing reactants include, but are not limited to, hydrogen sulfide ($H_2S$), carbonyl sulfide (COS), etc.

Where the protective film includes metal, a metal-containing reactant may be used. Example metals include, but are not limited to, tungsten, tin, molybdenum, zirconium, aluminum, and ruthenium.

Example tungsten-containing reactants include, but are not limited to, bis(butylcyclopentadienyl)tungsten(IV) diiodide ($C_{18}H_{26}I_2W$); bis(tert-butylimino)bis(tert-butylamino) tungsten (($C_4H_9NH)_2W(C_4H_9N)_2$); bis(tert-butylimino)bis (dimethylamino)tungsten(VI) ((($CH_3)_3CN)_2W(N(CH_3)_2)_2$); bis(cyclopentadienyl)tungsten(IV) dichloride ($C_{10}H_{10}Cl_2W$); bis(cyclopentadienyl)tungsten(IV) dihydride ($C_{10}H_{12}W$); bis(isopropylcyclopentadienyl)tungsten(IV) dihydride (($C_5H_4CH(CH_3)_2)_2WH_2$); cyclopentadienyltungsten(II) tricarbonyl hydride ($C_5H_6O_3W$); tetracarbonyl(1,5-cyclooctadiene)tungsten(0) ($C_{12}H_{12}O_4W$); triamminetungsten(IV) tricarbonyl (($NH_3)_3W(CO)_3$); tungsten hexacarbonyl ($W(CO)_6$), etc.

Example tin-containing reactants include, but are not limited to, bis[bis(trimethylsilyl)amino]tin(II) ($[[(CH_3)_3Si]_2N]_2Sn$); hexaphenylditin(IV) ($[(C_6H_5)_3Sn]_2$); tetraallyltin (($H_2C=CHCH_2)_4Sn$); tetrakis(diethylamido)tin(IV) ($[(C_2H_5)_2N]_4Sn$); tetrakis(dimethylamido)tin(IV) ($[(CH_3)_2N]_4Sn$); tetramethyltin ($Sn(CH_3)_4$); tetravinyltin ($Sn(CH=CH_2)_4$); tin(II) acetylacetonate ($CioH_{14}O_4Sn$); trimethyl(phenylethynyl)tin ($C_6H_5C\equiv CSn(CH_3)_3$); trimethyl(phenyl)tin ($C_6H_5Sn(CH_3)_3$), etc.

Example molybdenum-containing reactants include, but are not limited to, (bicyclo[2.2.1]hepta-2,5-diene)tetracarbonylmolybdenum(O) ($C_{11}H_8MoO_4$); bis(cyclopentadienyl)molybdenum(IV) dichloride ($C_{10}H_{10}Cl_2Mo$); cyclopentadienylmolybdenum(II) tricarbonyl ($C_{16}H_{10}Mo_2O_6$); molybdenumhexacarbonyl ($Mo(CO)_6$); (propylcyclopentadienyl)molybdenum(I) tricarbonyl ($C_{22}H_{22}Mo_2O_6$), etc.

Example ruthenium-containing reactants include, but are not limited to, bis(cyclopentadienyl)ruthenium(II) ($C_{10}H_{10}Ru$); bis(ethylcyclopentadienyl)ruthenium(II) ($C_7H_9RuC_7H_9$); triruthenium dodecacarbonyl ($Ru_3(CO)_{12}$), etc.

Example aluminum-containing reactants include, but are not limited to, aluminum tris(2,2,6,6-tetramethyl-3,5-heptanedionate) ($Al(OCC(CH_3)_3CHCOC(CH_3)_3)_3$); triisobutylaluminum ($[(CH_3)_2CHCH_2]_3Al$); trimethylaluminum (($CH_3)_3Al$); tris(dimethylamido)aluminum(III) ($Al(N(CH_3)_2)_3$), etc.

Example zirconium-containing reactants include, but are not limited to, bis(cyclopentadienyl)zirconium(IV) dihydride ($C_{10}H_{12}Zr$); bis(methyl-η5-cyclopentadienyl)methoxymethylzirconium ($Zr(CH_3C_5H_4)_2CH_3OCH_3$); dimethylbis(pentamethylcyclopentadienyl)zirconium(IV) ($C_{22}H_{36}Zr$); tetrakis(diethylamido)zirconium(IV) ($[(C_2H_5)_2N]_4Zr$); tetrakis(dimethylamido)zirconium(IV) ($[(CH_3)_2N]_4Zr$); tetrakis(dimethylamido)zirconium(IV) ($[(CH_3)_2N]_4Zr$); tetrakis(ethylmethylamido)zirconium(IV) ($Zr(NCH_3C_2H_5)_4$); zirconium(IV) dibutoxide(bis-2,4-pentanedionate) ($C_{18}H_{32}O_6Zr$); zirconium(IV) 2-ethylhexanoate ($Zr(C_8H_{15}O_2)_4$); zirconium tetrakis(2,2,6,6-tetramethyl-3,5-heptanedionate) ($Zr(OCC(CH_3)_3CHCOC(CH_3)_3)_4$), etc.

The disclosed precursors are not intended to be limiting. Other reactants may also be used as known by those of ordinary skill in the art. Frequently, oxygen may be provided along with one or more of the reactants. In some embodiments, a mask layer used to define the features on the substrate may be sensitive to oxidation. Carbon-based mask materials may be particularly sensitive to damage arising from oxidation during the deposition step. In certain embodiments herein, a metal oxide protective layer may be formed using a combination of a metal-containing reactant and carbonyl sulfide (COS). Carbonyl sulfide has been shown to form oxides without damaging oxidation-sensitive mask materials.

In some embodiments, the protective film may be made of a material selected from the group consisting of tungsten carbonitride, tungsten sulfide, tin, tin oxide, tin nitride, tin carbide, tin carbonitride, tin sulfide, molybdenum, molybdenum oxide, molybdenum carbide, molybdenum nitride, molybdenum carbonitride, molybdenum sulfide, ruthenium carbonitride, ruthenium sulfide, aluminum carbonitride, aluminum sulfide, zirconium, zirconium oxide, zirconium nitride, zirconium carbide, zirconium carbonitride, zirconium sulfide, and combinations thereof.

As noted above, the precursor(s) and fragments thereof used to form the protective layer may have relatively low sticking coefficients, thereby enabling the precursors to penetrate to a desired depth within the etched features. In some cases, the sticking coefficient of the precursors (at the relevant deposition conditions) may be about 0.05 or less, for example about 0.001 or less. Similarly, the precursor(s) and fragments thereof used to form the protective film may have a relatively low recombination rate. Species having low recombination rates are better able to penetrate deep into a feature while remaining reactive. The loss coefficient addresses the loss of reactant species due to both recombination and absorption on surfaces. In a number of embodiments, the loss coefficient is relatively low, such that reactant species are able to survive and penetrate deep into high aspect ratio features while remaining reactive. This allows the protective coating to be deposited along a substantial fraction of the length/depth of the partially etched feature. In certain cases the coating may be deposited along the entire length of the feature. In various cases, the loss coefficient may be less than about 0.005.

The reaction mechanism for forming the protective film may be cyclic (e.g., ALD) or continuous (e.g., CVD). Any method that results in the formation of the protective film at high aspect ratios may be used. As mentioned, ALD reactions may be particularly well suited for this purpose due to their tunable conformality and adsorption-limited properties. However, other types of reactions may be used so long as the film is able to form at a desired depth to protect the sidewalls deep in an etched feature.

Briefly, ALD reactions involve cyclically performing the following operations: (a) delivery of a first reactant to form an adsorbed precursor layer, (b) an optional purge operation to remove the unadsorbed first reactant from the reaction chamber, (c) delivery of a second reactant, and reaction between the first and second reactants on the substrate, (d) an optional purge to remove excess reactants and byproducts, and (e) repeating (a)-(d) until the film reaches a desired thickness. Because the reactants are provided at separate times and the reaction is a surface reaction, the method may be adsorption limited to some degree. This results in the formation of tunably conformal films that can line recessed features at the desired sidewall location, thus preventing bow formation. By contrast, CVD methods typically involve gas phase reactions where reactant(s) are delivered to the substrate in a continuous (non-cyclic) manner. Some CVD methods can be carried out with a relatively high/desired degree of conformality.

The following reaction conditions may be used in certain embodiments where the deposition reaction occurs through plasma assisted ALD methods. The substrate temperature may be maintained between about 0-500° C., for example between about 20-200° C. The pressure may be maintained as low as about 100 or 200 mTorr (e.g., about 13 or 26 Pa, respectively) and as high as about 1, 2, or 3 Torr (e.g., about 130, 270, or 400 Pa, respectively). The ion energy may be relatively low, for example below about 1 kV. The RF frequency used to generate the plasma may be about 60 MHz, though other frequencies may also be used. The RF power may be a few hundred Watts, for example about 500 W or less (e.g., about 7100 W/m$^2$ or less), about 400 W or less (e.g., about 7100 W/m$^2$ or less), or about 300 W or less (e.g., about 7100 W/m$^2$ or less). The reported power levels assume that the power is delivered to a single 300 mm wafer, the power scaling linearly based on substrate area for additional or differently sized substrates. During each ALD cycle, the adsorbing reactant may be delivered for a duration between about 0.5-20 seconds, at a flow rate between about 50-1000 sccm. The first purge may have a duration between about 0-60 seconds. The plasma may be exposed to the substrate for a duration between about 0.5-120 seconds, with a flow rate of a reactant (excluding any inert gas provided along with the reactant) between about 50-1000 sccm. A flow rate of hydrogen during the plasma exposure may be between about 0-1000 sccm. The post-RF purge may have a duration between about 0-60 seconds. These conditions can be tailored during each deposition to target deposition of the protective film at a desired depth within the feature.

The following reaction conditions may be used in various embodiments where the deposition reaction occurs through thermal (non-plasma) ALD methods. The substrate temperature may be maintained between about 150-500° C., for example between about 250-400° C. The pressure may be maintained as low as about 100 or 200 mTorr (e.g., about 13 or 26 Pa, respectively), and as high as about 1, 2 or 3 Torr (e.g., about 130, 270, or 400 Pa, respectively). During each ALD cycle, the adsorbing reactant may be delivered for a duration between about 0.15-20 seconds, at a flow rate between about 50-1000 sccm. The first purge may have a duration between about 0-60 seconds. The plasma may be exposed to the substrate for a duration between about 0.15-120 seconds, with a flow rate of a reactant (excluding any inert gas provided along with the reactant) between about 50-1000 sccm. The second purge may have a duration between about 0-60 seconds. These conditions can be tailored during each deposition to target deposition of the protective film at a desired depth within the feature.

The following reaction conditions may be used in certain embodiments where the deposition reaction occurs through plasma assisted CVD methods. The substrate temperature may be maintained between about 0-500° C., for example between about 20-200° C. The pressure may be maintained between about 100-3000 mT (e.g., 13-400 Pa). The RF frequency used to generate the plasma may be 2-60 MHz. The RF power used to generate the plasma may be between about 50-2000 W (e.g. between about 700-28,000 W/m$^2$), for example between about 100-800 W (e.g., between about 1,400-11,300 W/m$^2$). The duration of the reactant delivery and plasma exposure may be between about 1-180 seconds. The flow rates depend on the particular reactants. These conditions can be tailored during each deposition to target deposition of the protective film at a desired depth within the feature.

The following reaction conditions may be used in certain embodiments where the deposition reaction occurs through thermal (non-plasma) CVD methods. The substrate temperature may be maintained between about −10-500° C., for example between about 20-300° C. The pressure may be maintained between about 100-3000 mT (e.g., 13-400 Pa). The duration of the reactant delivery may be between about 1-180 seconds. The flow rates depend on the particular reactants. The ALD and CVD reaction conditions are provided as guidance and are not intended to be limiting. These conditions can be tailored during each deposition to target deposition of the protective film at a desired depth within the feature.

In certain embodiments where plasma is used, the plasma may be a capacitively coupled plasma. In some other embodiments, the plasma may be an inductively coupled plasma, a remotely generated plasma, a microwave plasma, etc. In some implementations, the plasma is a capacitively coupled plasma generated at one or more frequencies as mentioned above. The frequency or frequencies used to generate the plasma may include low frequency (LF) components and/or high frequency (HF) components. In some cases only HF frequencies are used during particular processing steps where plasma is present.

D. Mask Doping Process

The mask layer may be optionally doped with one or more material, as explained in relation to operation 201 of FIG. 2. In many cases, the mask layer is carbon or silicon. The mask layer may be doped with one or more metals in various implementations. The metal doped into the mask layer may be the same as a metal present in the protective film deposited on sidewalls. Alternatively or in addition, the mask layer may be doped with boron.

In a particular example, the mask layer is carbon doped with tungsten. In these or other cases, the protective film may comprise a tungsten-containing material such as tungsten carbonitride or tungsten sulfide. In another example, the mask layer is carbon doped with tin. In these or other cases, the protective film may comprise a tin-containing material such as tin, tin oxide, tin nitride, tin carbide, tin carbonitride, or tin sulfide. In another example, the mask layer is carbon doped with molybdenum. In these or other cases, the protective film may comprise a molybdenum-containing material such as molybdenum, molybdenum oxide, molybdenum carbide, molybdenum nitride, molybdenum carbonitride, or molybdenum sulfide. In another example, the mask layer is carbon doped with ruthenium. In these or other cases, the protective film may comprise a ruthenium-containing material such as ruthenium carbonitride or ruthenium sulfide. In another example, the mask layer is carbon doped with aluminum. In these or other cases, the protective film may comprise an aluminum-containing material such as aluminum carbonitride or aluminum sulfide. In another example, the mask layer is carbon doped with zirconium. In these or other cases, the protective film may comprise a zirconium-containing material such as zirconium, zirconium oxide, zirconium nitride, zirconium carbide, zirconium carbonitride, or zirconium sulfide.

Any available method may be used to dope the mask layer. In certain implementations, ion implantation is used. The ions may originate from a doping plasma. The penetration depth of the ions depends on the ion implant energy. In some other implementations, dopants may be introduced to the mask layer via diffusion from a gaseous or liquid source.

After doping, the mask layer (or a portion thereof) may have a dopant concentration between about 20-70% (atomic).

E. Pre-Treatment Process

The substrate may be optionally pre-treated to remove or otherwise alter the fluorocarbon-based coating as described in relation to operation 205 of FIG. 2. The fluorocarbon-based coating may be treated by exposing the substrate to plasma in various cases. For instance, exposure to $N_2/H_2$ plasma may remove the fluorine from the fluorocarbon-based coating. In some cases exposure to $N_2/H_2$ plasma may remove practically all of the fluorocarbon-based coating. In these or other cases, the plasma pre-treatment (e.g., with gases such as $H_2$, He, $O_2$, or a combination thereof) might be used to enable or promote nucleation for the protective film deposited in operation 207 of FIG. 2.

F. Protective Film Removal Process

After the feature is etched, the protective film may be optionally removed from the sidewalls of the feature, as discussed in relation to operation 211 of FIG. 2. The protective film may be removed through wet cleaning methods or dry cleaning methods.

In some cases, the protective film is removed through a wet chemical cleaning method. In a particular example, hydrogen peroxide ($H_2O_2$) is used to remove the protective film. $H_2O_2$ is especially useful for removing tungsten-based protective films, such as those made of tungsten carbonitride or tungsten sulfide. Other species that may be used for wet cleaning methods include, but are not limited to, sulfur dichloride (SCl). Where wet cleaning is used, the chemical cleaning agent may be introduced onto the substrate for a duration sufficient to remove all or substantially all of the protective film (or to remove all or substantially all of a metal present in the protective film).

In some cases, the protective film is removed through a dry cleaning method. In such cases, the substrate may be exposed to plasma that strips the protective film (or a metal therein) from the sidewalls of the feature. In one example, the substrate is exposed to a plasma generated from $Cl_2O_2$ to thereby remove the protective film. $Cl_2O_2$ plasma is particularly useful for removing tungsten-based protective films such as those made of tungsten carbonitride or tungsten sulfide. Example plasma generation frequencies may be between about 1 MHz-13 MHz, example plasma generation powers may be between about 500 W-6000 W, example substrate support temperatures may be between about 200° C.-500° C., example pressures may be between about 100 mTorr-4000 mTorr, example plasma exposure durations may be between about 1 min-5 mins.

G. Oxidation Process

In various implementations, any remaining protective film may be oxidized after the feature is fully etched, as explained in relation to operation 213 of FIG. 2. Oxidation may be accomplished by exposing the substrate to oxidizing gas or plasma, for example. Where plasma-based oxidation is used, the plasma may be generated from oxygen-containing species such as oxygen ($O_2$), ozone ($O_3$), and/or various oxygen-containing species mentioned above. Example plasma generation frequencies may be between about 1 MHz-13.56 MHz, example plasma generation powers may be between about 100 W-5000 W, example substrate support temperatures may be between about 40° C.-120° C., example pressures may be between about 10 mTorr-1 Torr, example plasma exposure durations may be between about 10 s-2 mins.

This oxidation step oxidizes any remaining protective film within the feature, thereby ensuring that any such material is electrically insulating.

V. Apparatus

The methods described herein may be performed by any suitable apparatus or combination of apparatus. A suitable apparatus includes hardware for accomplishing the process operations and a system controller having instructions for controlling process operations in accordance with the present invention. For example, in some embodiments, the hardware may include one or more process stations included in a process tool. One process station may be an etching station and another process station may be a deposition station. In another embodiment, etching and deposition occur in a single station/chamber.

Figure 4A:
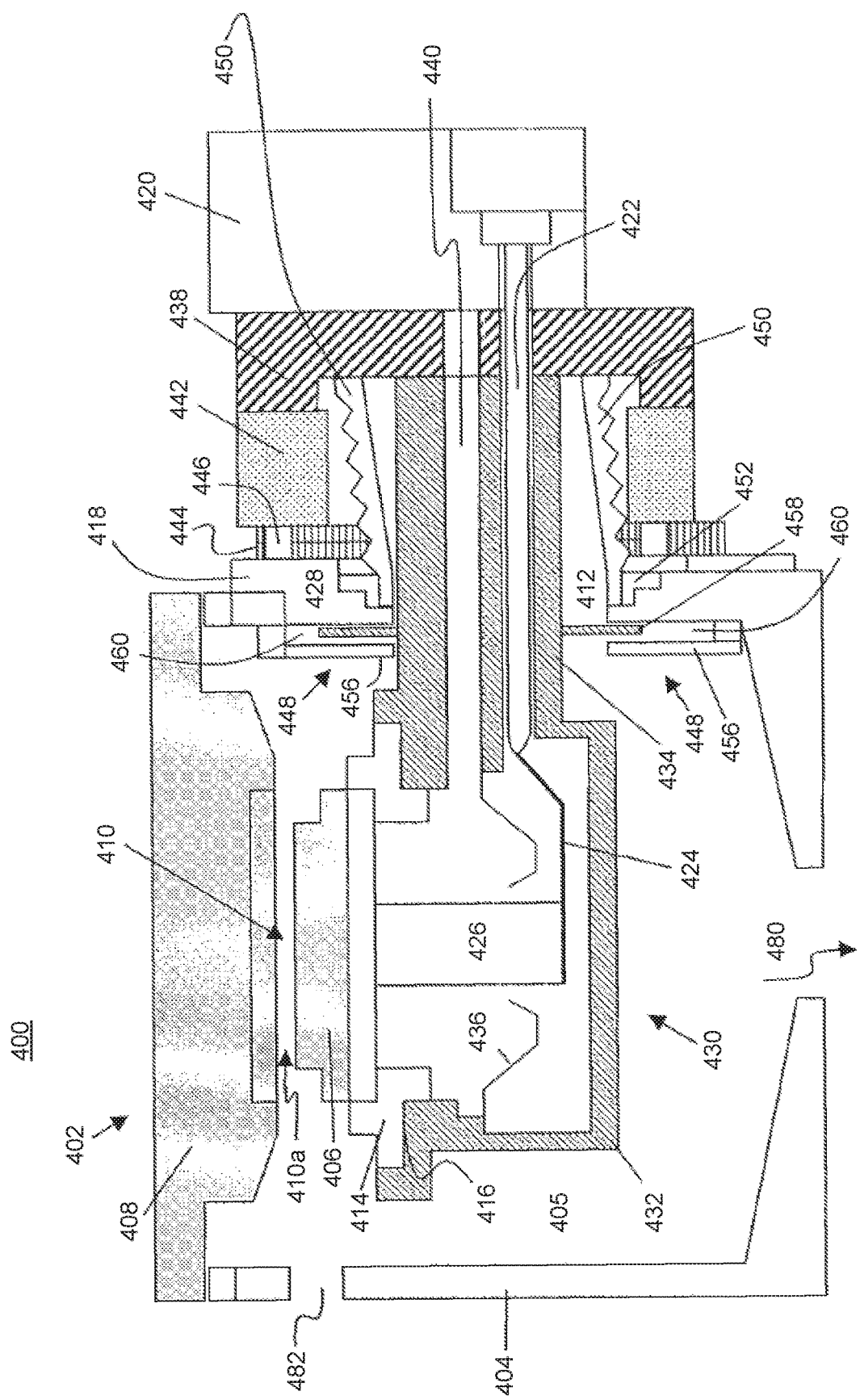
FIGS. 4A-4C illustrate a reaction chamber that may be used to perform the etching processes described herein according to certain embodiments.
Figure 4B:
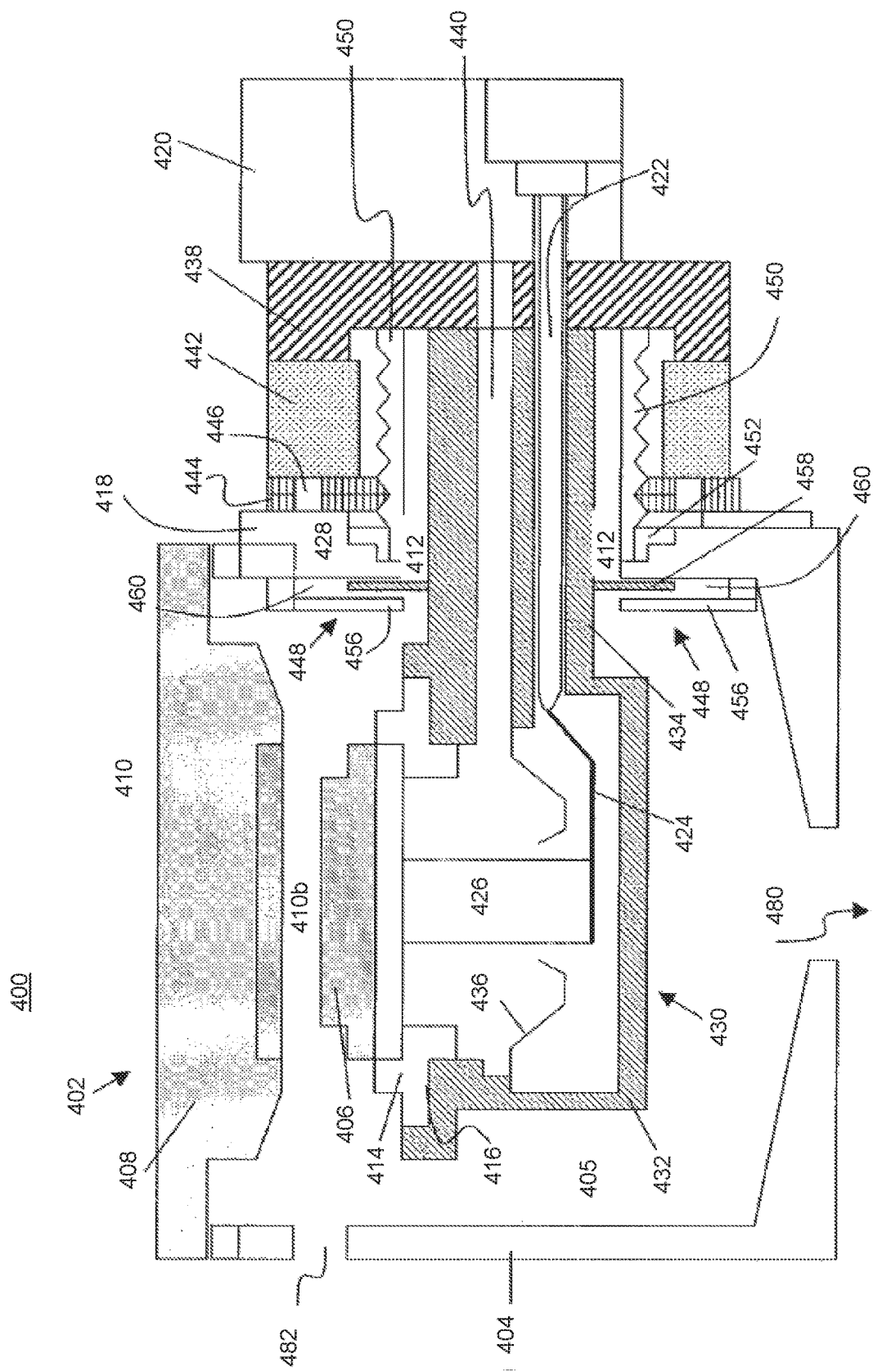
Figure 4C:
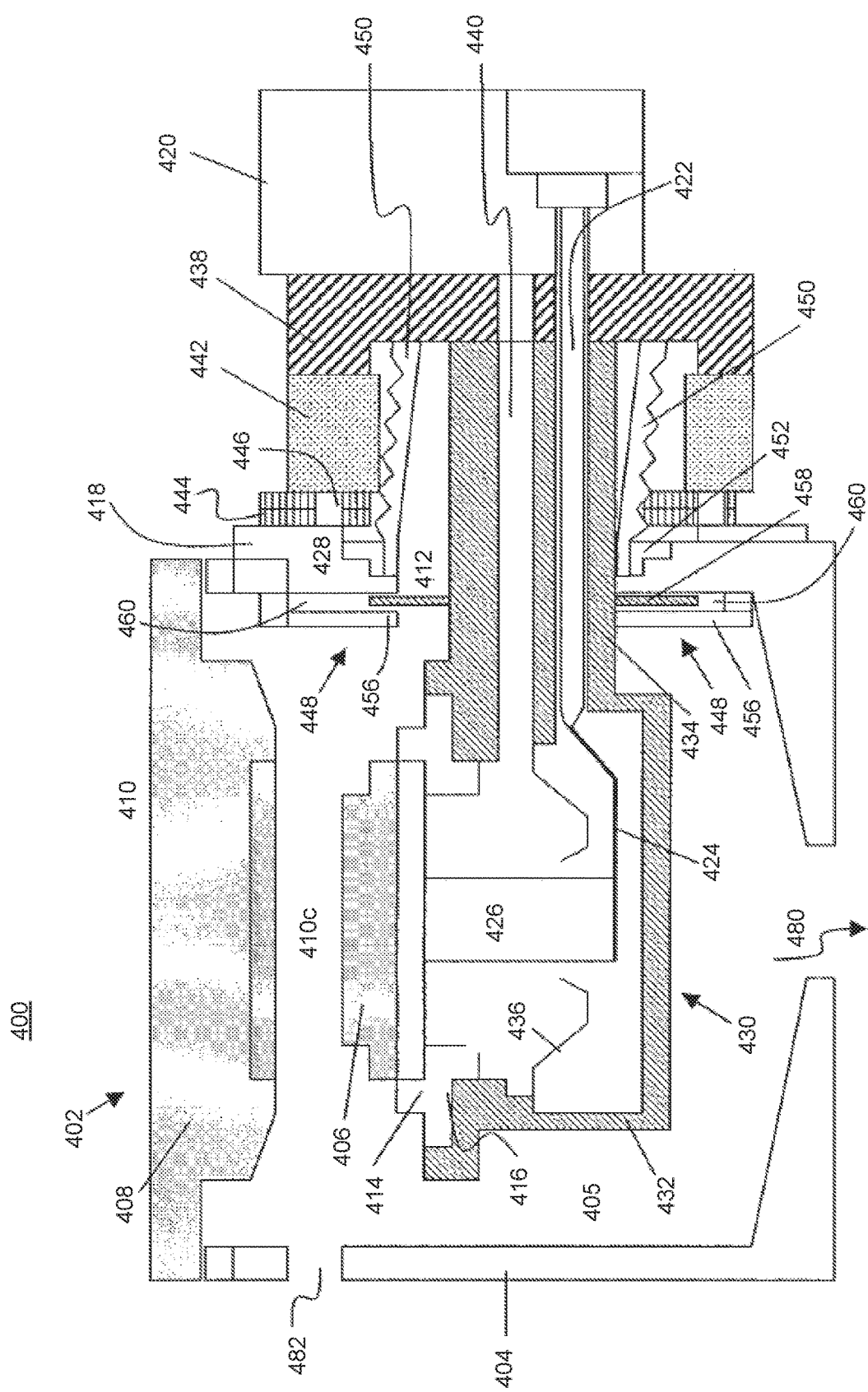

FIGS. 4A-4C illustrate an embodiment of an adjustable gap capacitively coupled confined RF plasma reactor 400 that may be used for performing the etching operations described herein. As depicted, a vacuum chamber 402 includes a chamber housing 404, surrounding an interior space housing a lower electrode 406. In an upper portion of the chamber 402 an upper electrode 408 is vertically spaced apart from the lower electrode 406. Planar surfaces of the upper and lower electrodes 408, 406 are substantially parallel and orthogonal to the vertical direction between the electrodes. Preferably the upper and lower electrodes 408, 406 are circular and coaxial with respect to a vertical axis. A lower surface of the upper electrode 408 faces an upper surface of the lower electrode 406. The spaced apart facing electrode surfaces define an adjustable gap 410 therebetween. During operation, the lower electrode 406 is supplied RF power by an RF power supply (match) 420. RF power is supplied to the lower electrode 406 though an RF supply conduit 422, an RF strap 424 and an RF power member 426. A grounding shield 436 may surround the RF power member 426 to provide a more uniform RF field to the lower electrode 406. As described in commonly-owned U.S. Pat. No. 7,732,728, the entire contents of which are herein incorporated by reference, a wafer is inserted through wafer port 482 and supported in the gap 410 on the lower electrode 406 for processing, a process gas is supplied to the gap 410 and excited into plasma state by the RF power. The upper electrode 408 can be powered or grounded.

In the embodiment shown in FIGS. 4A-4C, the lower electrode 406 is supported on a lower electrode support plate 416. An insulator ring 414 interposed between the lower electrode 406 and the lower electrode Support plate 416 insulates the lower electrode 406 from the support plate 416.

An RF bias housing 430 supports the lower electrode 406 on an RF bias housing bowl 432. The bowl 432 is connected through an opening in a chamber wall plate 418 to a conduit support plate 438 by an arm 434 of the RF bias housing 430. In a preferred embodiment, the RF bias housing bowl 432 and RF bias housing arm 434 are integrally formed as one component, however, the arm 434 and bowl 432 can also be two separate components bolted or joined together.

The RF bias housing arm 434 includes one or more hollow passages for passing RF power and facilities, such as gas coolant, liquid coolant, RF energy, cables for lift pin control, electrical monitoring and actuating signals from outside the vacuum chamber 402 to inside the vacuum chamber 402 at a space on the backside of the lower electrode 406. The RF supply conduit 422 is insulated from the RF bias housing arm 434, the RF bias housing arm 434 providing a return path for RF power to the RF power supply 420. A facilities conduit 440 provides a passageway for facility components. Further details of the facility components are described in U.S. Pat. Nos. 5,948,704 and 7,732,728 and are not shown here for simplicity of description. The gap 410 is preferably surrounded by a confinement ring assembly or shroud (not shown), details of which can be found in commonly owned published U.S. Pat. No. 7,740,736 herein incorporated by reference. The interior of the vacuum chamber 402 is maintained at a low pressure by connection to a vacuum pump through vacuum portal 480.

The conduit support plate 438 is attached to an actuation mechanism 442. Details of an actuation mechanism are described in commonly-owned U.S. Pat. No. 7,732,728 incorporated herein by above. The actuation mechanism 442, such as a servo mechanical motor, stepper motor or the like is attached to a vertical linear bearing 444, for example, by a screw gear 446 such as a ball screw and motor for rotating the ball screw. During operation to adjust the size of the gap 410, the actuation mechanism 442 travels along the vertical linear bearing 444. FIG. 4A illustrates the arrangement when the actuation mechanism 442 is at a high position on the linear bearing 444 resulting in a small gap 410 a. FIG. 4B illustrates the arrangement when the actuation mechanism 442 is at a mid position on the linear bearing 444. As shown, the lower electrode 406, the RF bias housing 430, the conduit support plate 438, the RF power supply 420 have all moved lower with respect to the chamber housing 404 and the upper electrode 408, resulting in a medium size gap 410 b.

FIG. 4C illustrates a large gap 410 c when the actuation mechanism 442 is at a low position on the linear bearing. Preferably, the upper and lower electrodes 408, 406 remain co-axial during the gap adjustment and the facing surfaces of the upper and lower electrodes across the gap remain parallel.

This embodiment allows the gap 410 between the lower and upper electrodes 406, 408 in the CCP chamber 402 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 406, 408.

FIG. 4A illustrates laterally deflected bellows 450 sealed at a proximate end to the conduit support plate 438 and at a distal end to a stepped flange 428 of chamber wall plate 418. The inner diameter of the stepped flange defines an opening 412 in the chamber wall plate 418 through which the RF bias housing arm 434 passes. The distal end of the bellows 450 is clamped by a clamp ring 452.

The laterally deflected bellows 450 provides a vacuum seal while allowing vertical movement of the RF bias housing 430, conduit support plate 438 and actuation mechanism 442. The RF bias housing 430, conduit support plate 438 and actuation mechanism 442 can be referred to as a cantilever assembly. Preferably, the RF power supply 420 moves with the cantilever assembly and can be attached to the conduit support plate 438. FIG. 4B shows the bellows 450 in a neutral position when the cantilever assembly is at a mid position. FIG. 4C shows the bellows 450 laterally deflected when the cantilever assembly is at a low position.

A labyrinth seal 448 provides a particle barrier between the bellows 450 and the interior of the plasma processing chamber housing 404. A fixed shield 456 is immovably attached to the inside inner wall of the chamber housing 404 at the chamber wall plate 418 so as to provide a labyrinth groove 460 (slot) in which a movable shield plate 458 moves vertically to accommodate vertical movement of the cantilever assembly. The outer portion of the movable shield plate 458 remains in the slot at all vertical positions of the lower electrode 406.

In the embodiment shown, the labyrinth seal 448 includes a fixed shield 456 attached to an inner surface of the chamber wall plate 418 at a periphery of the opening 412 in the chamber wall plate 418 defining a labyrinth groove 460. The movable shield plate 458 is attached and extends radially from the RF bias housing arm 434 where the arm 434 passes through the opening 412 in the chamber wall plate 418. The movable shield plate 458 extends into the labyrinth groove 460 while spaced apart from the fixed shield 456 by a first gap and spaced apart from the interior surface of the chamber wall plate 418 by a second gap allowing the cantilevered assembly to move vertically. The labyrinth seal 448 blocks migration of particles spalled from the bellows 450 from entering the vacuum chamber interior 405 and blocks radicals from process gas plasma from migrating to the bellows 450 where the radicals can form deposits which are subsequently spalled.

FIG. 4A shows the movable shield plate 458 at a higher position in the labyrinth groove 460 above the RF bias housing arm 434 when the cantilevered assembly is in a high position (small gap 410 a). FIG. 4C shows the movable shield plate 458 at a lower position in the labyrinth groove 460 above the RF bias housing arm 434 when the cantilevered assembly is in a low position (large gap 410 c). FIG. 4B shows the movable shield plate 458 in a neutral or mid position within the labyrinth groove 460 when the cantilevered assembly is in a mid position (medium gap 410 b). While the labyrinth seal 448 is shown as symmetrical about the RF bias housing arm 434, in other embodiments the labyrinth seal 448 may be asymmetrical about the RF bias arm 434.

Figure 5:
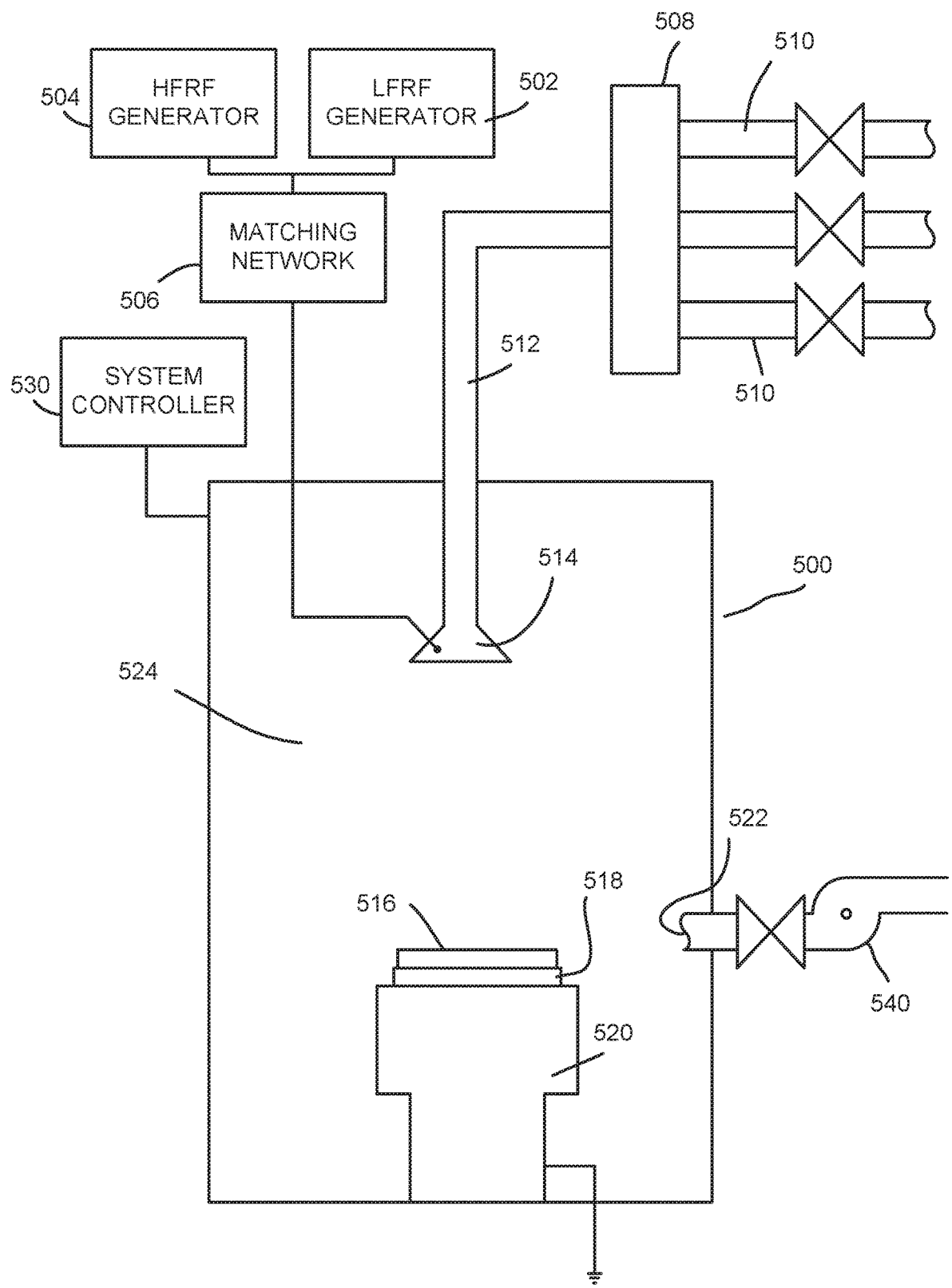
FIG. 5 depicts a reaction chamber that may be used to perform the deposition processes described herein according to certain embodiments.

FIG. 5 provides a simple block diagram depicting various reactor components arranged for implementing deposition methods described herein. As shown, a reactor 500 includes a process chamber 524 that encloses other components of the reactor and serves to contain a plasma generated by a capacitive-discharge type system including a showerhead 514 working in conjunction with a grounded heater block 520. A high frequency (HF) radio frequency (RF) generator 504 and a low frequency (LF) RF generator 502 may be connected to a matching network 506 and to the showerhead 514. The power and frequency supplied by matching network 506 may be sufficient to generate a plasma from process gases supplied to the process chamber 524. For example, the matching network 506 may provide 50 W to 500 W (e.g., 700 to 7,100 W/m$^2$) of HFRF power. In some examples, the matching network 506 may provide 100 W to 5000 W (e.g., 1,400 to 71,000 W/m$^2$) of HFRF power and 100 W to 5000 W (e.g., 1,400 to 71,000 W/m$^2$) of LFRF power total energy. In a typical process, the HFRF component may generally be between 5 MHz to 60 MHz, e.g., 13.56 MHz, about 27 MHz, or about 60 MHz in some cases. In operations where there is an LF component, the LF component may be from about 100 kHz to 2 MHz, e.g., about 430 kHz or about 2 MHz in some cases.

Within the reactor, a wafer pedestal 518 may support a substrate 516. The wafer pedestal 518 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 512. Multiple source gas lines 510 are connected to manifold 508. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases may exit chamber 524 via an outlet 522. A vacuum pump, e.g., a one or two stage mechanical dry pump and/or turbomolecular pump 540, may be used to draw process gases out of the process chamber 524 and to maintain a suitably low pressure within the process chamber 524 by using a closed-loop-controlled flow restriction device, such as a throttle valve or a pendulum valve.

As discussed above, the techniques for deposition discussed herein may be implemented on a multi-station or single station tool. In specific implementations, a 300 mm Lam Vector™ tool having a 4-station deposition scheme or a 200 mm Sequel™ tool having a 6-station deposition scheme may be used. In some implementations, tools for processing 450 mm wafers may be used. In various implementations, the wafers may be indexed after every deposition and/or post-deposition plasma treatment, or may be indexed after etching operations if the etching chambers or stations are also part of the same tool, or multiple depositions and treatments may be conducted at a single station before indexing the wafer.

In some embodiments, an apparatus may be provided that is configured to perform the techniques described herein. A suitable apparatus may include hardware for performing various process operations as well as a system controller 530 having instructions for controlling process operations in accordance with the disclosed embodiments. The system controller 530 will typically include one or more memory devices and one or more processors communicatively connected with various process control equipment, e.g., valves, RF generators, wafer handling systems, etc., and configured to execute the instructions so that the apparatus will perform a technique in accordance with the disclosed embodiments. Machine-readable media containing instructions for controlling process operations in accordance with the present disclosure may be coupled to the system controller 530. The controller 530 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 530 may control all of the activities of the reactor 500. The system controller 530 may execute system control software stored in a mass storage device, loaded into a memory device, and executed on a processor. The system control software may include instructions for controlling the timing of gas flows, wafer movement, RF generator activation, etc., as well as instructions for controlling the mixture of gases, the chamber and/or station pressure, the chamber and/or station temperature, the wafer temperature, the target power levels, the RF power levels, the substrate pedestal, chuck, and/or susceptor position, and other parameters of a particular process performed by the reactor apparatus 500. The system control software may be configured in any suitable way. For example, various process tool component subroutines or control objects may be written to control operation of the process tool components necessary to carry out various process tool processes. The system control software may be coded in any suitable computer readable programming language.

The system controller 530 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 530.

Figure 6:
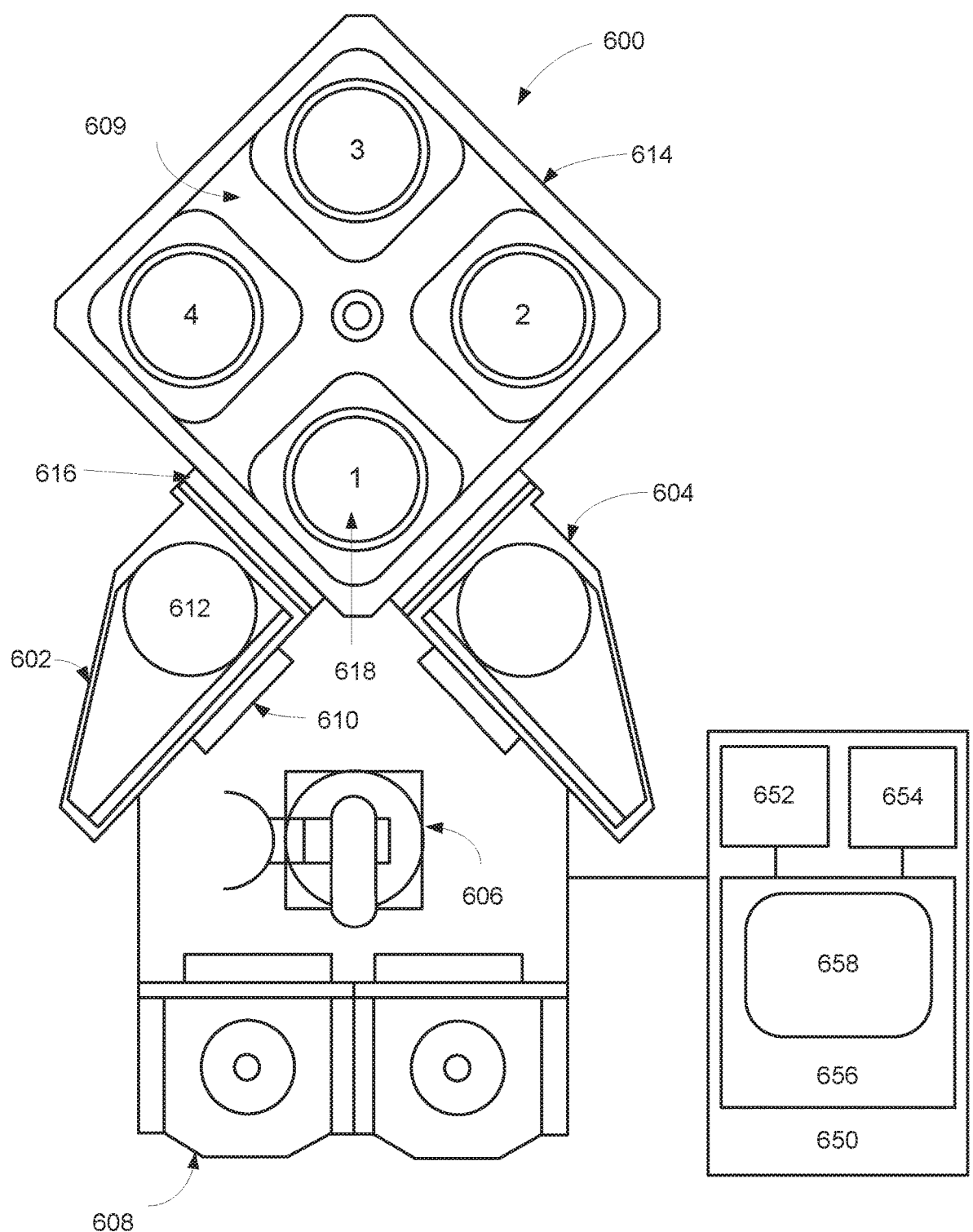
FIG. 6 shows a multi-station apparatus that may be used to perform the deposition processes in certain implementations.

One or more process stations may be included in a multi-station processing tool. FIG. 6 shows a schematic view of an embodiment of a multi-station processing tool 600 with an inbound load lock 602 and an outbound load lock 604, either or both of which may include a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 includes a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted includes load locks, it will be appreciated that, in some embodiments, direct entry of a wafer into a process station may be provided.

The depicted processing chamber 614 includes four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. For example, each of the process stations 1-4 may be a chamber for performing one or more of ALD, CVD, CFD, or etching (any of which may be plasma assisted). In one embodiment, at least one of the process stations is a deposition station having a reaction chamber as shown in FIG. 5, and at least one of the other process stations is an etching station having a reaction chamber as shown in FIGS. 4A-4C. While the depicted processing chamber 614 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a wafer handling system 690 for transferring wafers within processing chamber 614. In some embodiments, wafer handling system 690 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing operations to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process operation or operations to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In certain embodiments, the controller has instructions to perform the operations shown and described in relation to FIG. 2A. For example, the controller may have instructions to cyclically (a) perform an etching operation to partially etch a feature on a substrate, and (b) deposit a protective sidewall coating in the etched feature without substantially etching the substrate. The instructions may relate to performing these processes using the disclosed reaction conditions. The instructions may also relate to transferring the substrate between etching and deposition chambers in some implementations.

Returning to the embodiment of FIG. 6, in some embodiments, system controller 650 controls all of the activities of process tool 600. System controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes. System control software 658 may be coded in any suitable computer readable programming language.

In some embodiments, system control software 658 may include input/output control (IOC) sequencing instructions for controlling the various parameters described above. For example, each phase of a CFD process may include one or more instructions for execution by system controller 650. The instructions for setting process conditions for an ALD process phase may be included in a corresponding ALD recipe phase. In some embodiments, the ALD recipe phases may be sequentially arranged, so that all instructions for an ALD process phase are executed concurrently with that process phase.

Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition and flow rates and optionally for flowing gas into one or more process stations prior to deposition in order to stabilize the pressure in the process station. In some embodiments, the controller includes instructions for cyclically (a) etching recessed features, and (b) depositing a metal-containing protective layer (having a composition as described herein) on sidewalls of the partially etched features, including appropriate instructions regarding flow of various process gasses.

A pressure control program may include code for controlling the pressure in the process station by regulating, for example, a throttle valve in the exhaust system of the process station, a gas flow into the process station, etc. In some embodiments, a pressure control program may include instructions for maintaining the reaction chamber(s) at appropriate pressure levels during the various stages of the etching/deposition methods as described herein.

A heater control program may include code for controlling the current to a heating unit that is used to heat the substrate. Alternatively, the heater control program may control delivery of a heat transfer gas (such as helium) to the substrate. In certain implementations, the controller includes instructions for etching the substrate at a first temperature and depositing a protective metal-containing sidewall coating at a second temperature.

A plasma control program may include code for setting RF power levels and exposure times in one or more process stations in accordance with the embodiments herein. In some embodiments, the controller includes instructions for controlling plasma characteristics during etching and/or deposition of a metal-containing protective sidewall coating. The instructions may relate to appropriate power levels, frequencies, duty cycles, etc.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the disclosed embodiments. Machine-readable, non-transitory media containing instructions for controlling process operations in accordance with the disclosed embodiments may be coupled to the system controller.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Figure 7:
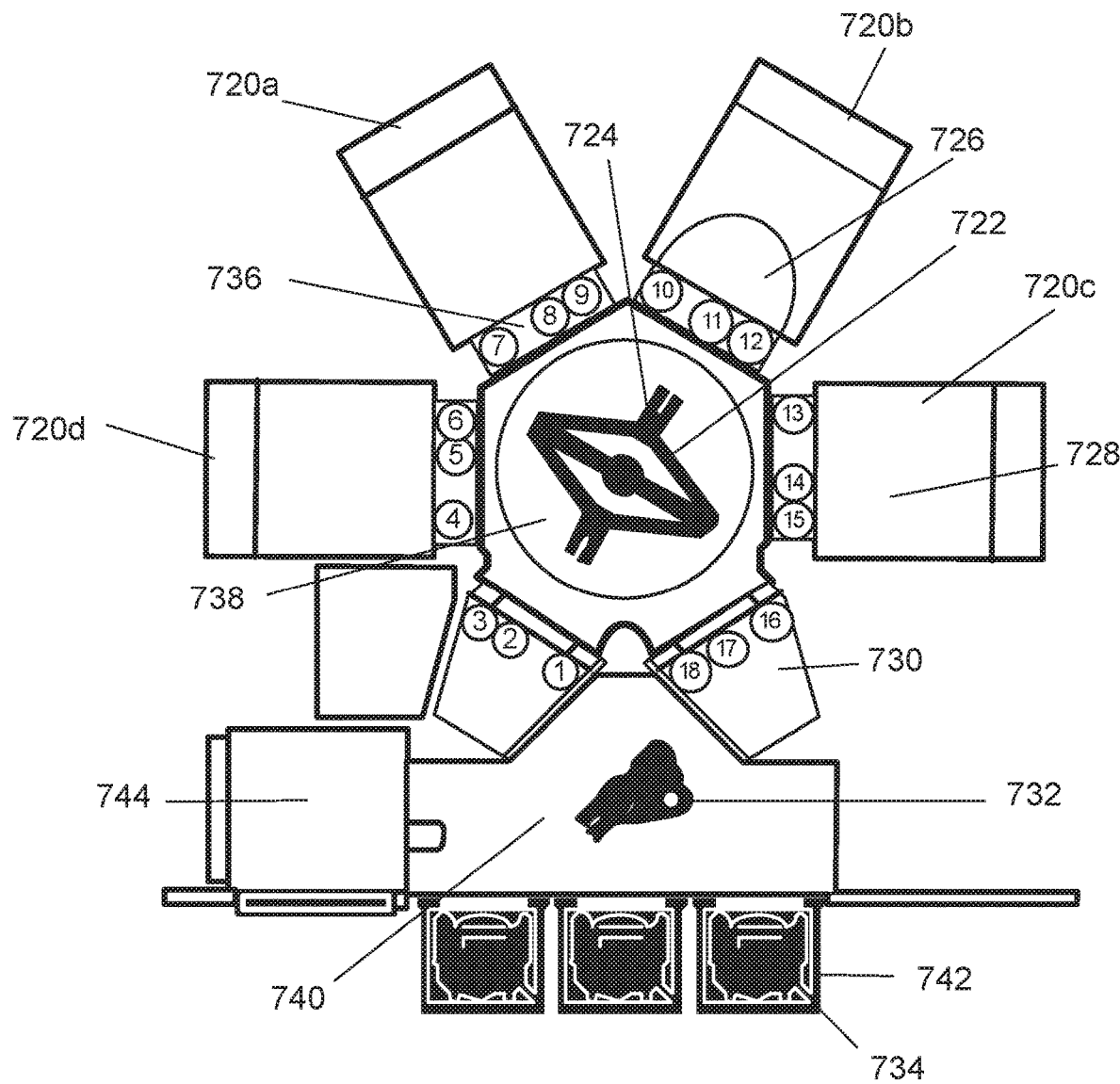
FIG. 7 presents a cluster tool that may be used to practice both deposition and etching according to certain embodiments.

FIG. 7 depicts a semiconductor process cluster architecture with various modules that interface with a vacuum transfer module 738 (VTM). The arrangement of transfer modules to "transfer" substrates among multiple storage facilities and processing modules may be referred to as a "cluster tool architecture" system. Airlock 730, also known as a loadlock or transfer module, is shown in VTM 738 with four processing modules 720a-720d, which may be individual optimized to perform various fabrication processes. By way of example, processing modules 720a-720d may be implemented to perform substrate etching, deposition, ion implantation, substrate cleaning, sputtering, and/or other semiconductor processes as well as laser metrology and other defect detection and defect identification methods. One or more of the processing modules (any of 720a-720d) may be implemented as disclosed herein, i.e., for etching recessed features into substrates, depositing protective films (or sub-layers therein) on sidewalls of recessed features, and other suitable functions in accordance with the disclosed embodiments. Airlock 730 and process modules 720a-720d may be referred to as "stations." Each station has a facet 736 that interfaces the station to VTM 738. Inside the facets, sensors 1-18 are used to detect the passing of substrate 726 when moved between respective stations.

In one example, processing module 720a may be configured for etching and processing module 720b may be configured for deposition. In another example, processing module 720a may be configured for etching, processing module 720b may be configured to deposit a first sub-layer of the protective sidewall coating, and processing module 720c may be configured to deposit a second sub-layer of the protective sidewall coating.

Robot 722 transfers substrates between stations. In one implementation, the robot may have one arm, and in another implementation, the robot may have two arms, where each arm has an end effector 724 to pick substrates for transport. Front-end robot 732, in atmospheric transfer module (ATM) 740, may be used to transfer substrates from cassette or Front Opening Unified Pod (FOUP) 734 in Load Port Module (LPM) 742 to airlock 730. Module center 728 inside process modules 720a-720d may be one location for placing the substrate. Aligner 744 in ATM 740 may be used to align substrates.

In an exemplary processing method, a substrate is placed in one of the FOUPs 734 in the LPM 742. Front-end robot 732 transfers the substrate from the FOUP 734 to the aligner 744, which allows the substrate 726 to be properly centered before it is etched, or deposited upon, or otherwise processed. After being aligned, the substrate is moved by the front-end robot 732 into an airlock 730. Because airlock modules have the ability to match the environment between an ATM and a VTM, the substrate is able to move between the two pressure environments without being damaged. From the airlock module 730, the substrate is moved by robot 722 through VTM 738 and into one of the process modules 720a-720d, for example process module 720a. In order to achieve this substrate movement, the robot 722 uses end effectors 724 on each of its arms. In process module 720a, the substrate undergoes etching as described herein to form a partially etched feature. Next, the robot 722 moves the substrate out of processing module 720a, into the VTM 738, and then into a different processing module 720b. In processing module 720b, a protective film is deposited on sidewalls of the partially etched feature. Then, the robot 722 moves the substrate out of processing module 720b, into the VTM 738, and into processing module 720a, where the partially etched feature is further etched. The etching/deposition can be repeated until the feature is fully etched.

It should be noted that the computer controlling the substrate movement can be local to the cluster architecture, or can be located external to the cluster architecture in the manufacturing floor, or in a remote location and connected to the cluster architecture via a network.

Experimental

Figure 8:
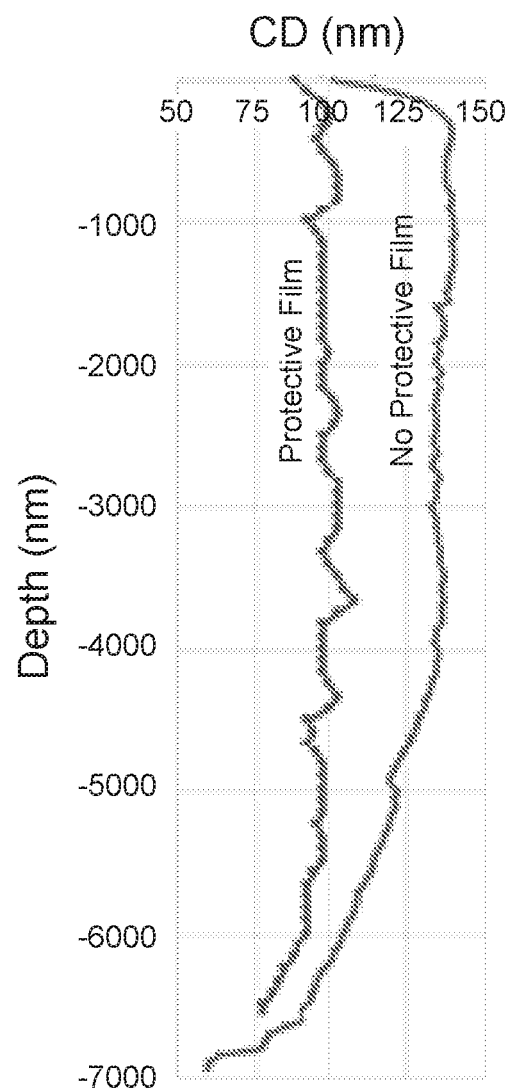
FIG. 8 illustrates experimental results showing the benefits associated with the protective films described herein.

FIG. 8 presents experimental data showing depth vs. critical diameter comparing cases where the feature was etched with or without deposition of a protective film. Where the protective film was not deposited, a substantial bow developed as the feature was etched. For example, the critical diameter ranged from about 60 nm near the bottom of the feature, to about 135 nm throughout a substantial middle portion of the feature, to about 100 nm at the top of the feature. By contrast, where the protective film was used, the bow was much less substantial. In this case, the critical diameter ranged from about 80 nm near the bottom of the feature, to about 100 nm throughout a substantial middle portion of the feature, to about 90 nm near the top of the feature. The critical diameter is much more uniform in the case where the protective film was used. In this example, the protective film was made of tin oxide.

In another experiment, a 7.3 µm feature was etched in a dielectric stack using the techniques described herein. The critical dimension at the bottom of the feature was 72 nm, and the critical dimension at the bow region was 107 nm.

Additional Embodiments

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The above detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

Unless otherwise defined for a particular parameter, the terms "about" and "approximately" as used herein are intended to mean±10% with respect to a relevant value.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed. Certain references have been incorporated by reference herein. It is understood that any disclaimers or disavowals made in such references do not necessarily apply to the embodiments described herein. Similarly, any features described as necessary in such references may be omitted in the embodiments herein.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of forming an etched feature in a dielectric-containing stack on a substrate, the method comprising:
   (a) partially etching the feature in the dielectric-containing stack by exposing the substrate to a first plasma comprising an etching reactant;
   (b) after (a), depositing a protective film on sidewalls of the feature, the protective film comprising at least one of a tungsten carbonitride, a tungsten sulfide, tin, a tin-containing compound, molybdenum, a molybdenum-containing compound, a ruthenium sulfide, an aluminum sulfide, zirconium, and a zirconium-containing compound, wherein the protective film is not deposited on bottoms of the etch features; and
   (c) repeating (a)-(b) until the feature is etched to a final depth, wherein the protective film deposited in (b) substantially prevents lateral etch of the feature during (a), and wherein the feature has an aspect ratio of about 5 or greater at its final depth.

2. The method of claim 1, wherein the protective film comprises tungsten carbonitride, tungsten oxide, or tungsten sulfide.

3. The method of claim 2, wherein the protective film comprises tungsten carbonitride.

4. The method of claim 1, wherein the protective film comprises tin, tin oxide, tin nitride, tin carbide, tin carbonitride, or tin sulfide.

5. The method of claim 4, wherein the protective film comprises tin oxide.

6. The method of claim 1, wherein the protective film comprises molybdenum, molybdenum oxide, molybdenum carbide, molybdenum nitride, molybdenum carbonitride, or molybdenum sulfide.

7. The method of claim 1, wherein the protective film comprises ruthenium sulfide.

8. The method of claim 1, wherein the protective film comprises aluminum sulfide.

9. The method of claim 1, wherein the protective film comprises zirconium, zirconium oxide, zirconium carbide, zirconium nitride, zirconium carbonitride, or zirconium sulfide.

10. The method of claim 1, wherein (b) comprises depositing the protective film through an atomic layer deposition reaction comprising:
    (i) exposing the substrate to a first deposition reactant and allowing the first deposition reactant to adsorb onto the sidewalls of the feature; and
    (ii) after (i), exposing the substrate to a second deposition reactant and reacting the first and second deposition reactants in a surface reaction, thereby forming the protective film on the sidewalls of the feature.

11. The method of claim 1, wherein (b) comprises depositing the protective film through a chemical vapor deposition reaction comprising exposing the substrate to a first deposition reactant and a second deposition reactant simultaneously.

12. The method of claim 1, further comprising doping a mask layer on the dielectric-containing stack prior to (a).

13. The method of claim 1, wherein (a) results in formation of a fluorocarbon-based coating on the sidewalls of the feature, the method further comprising after (a) and before (b), pre-treating the substrate to thereby remove or alter the fluorocarbon-based coating, and wherein pre-treating the substrate comprises exposing the substrate to plasma generated from either (i) a gas comprising $N_2$ and $H_2$, or (ii) a gas comprising $O_2$ and inert gas.

14. The method of claim 13, wherein the protective film comprises tungsten carbonitride.

15. The method of claim 1, wherein (a) results in formation of a fluorocarbon-based coating on the sidewalls of the feature, wherein the protective film comprises tin oxide, and wherein the tin oxide protective film is deposited in (b) directly on the fluorocarbon-based coating formed in (a).

16. The method of claim 1, further comprising removing the protective film from the sidewalls after the feature is fully etched.

17. The method of claim 1, wherein the protective film comprises tungsten carbonitride and is removed by exposing the substrate to $H_2O_2$, SCl, or a plasma generated from a gas comprising $Cl_2O_2$.

18. The method of claim 1, further comprising exposing the substrate to an oxidizing gas or plasma after the feature is fully etched to thereby oxidize any remaining protective film on the sidewalls of the feature forming metal oxides.

19. The method of claim 1, wherein (a) results in formation of a fluorocarbon-based coating on the sidewalls of the feature, the method further comprising after (a) and before (b), pre-treating the substrate to thereby remove the fluorocarbon-based coating.

20. A method of forming an etched feature in a dielectric-containing stack on a substrate, the method comprising:
  (a) partially etching the feature in the dielectric-containing stack by exposing the substrate to a first plasma comprising an etching reactant;
  (b) after (a), depositing a protective film on sidewalls of the feature, the protective film comprising at least one of a tungsten carbonitride, a tungsten sulfide, tin, a tin-containing compound, molybdenum, a molybdenum-containing compound, a ruthenium sulfide, an aluminum sulfide, zirconium, and a zirconium-containing compound, wherein the protective film comprises a metal sulfide; and
  (c) repeating (a)-(b) until the feature is etched to a final depth, wherein the protective film deposited in (b) substantially prevents lateral etch of the feature during (a), and wherein the feature has an aspect ratio of about 5 or greater at its final depth.

\* \* \* \* \*